(12) United States Patent
Matsuzaki

(10) Patent No.: US 7,391,255 B2
(45) Date of Patent: Jun. 24, 2008

(54) SEMICONDUCTOR PHASE ADJUSTMENT SYSTEM MODULE

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/874,037

(22) Filed: Jun. 6, 2001

(65) Prior Publication Data

US 2001/0050856 A1    Dec. 13, 2001

(30) Foreign Application Priority Data

Jun. 8, 2000    (JP) .............................. 2000-172483

(51) Int. Cl.
*H01L 25/00*    (2006.01)

(52) U.S. Cl. .......................... 327/565; 327/291; 327/141

(58) Field of Classification Search ................. 327/565, 327/141, 144–159, 162, 163, 291, 293, 295, 327/296, 299
See application file for complete search history.

(56) References Cited

U.S. PATENT DOCUMENTS

| | | | | |
|---|---|---|---|---|
| 5,122,679 A * | 6/1992 | Ishii et al. .................... | 327/147 |
| 5,317,601 A * | 5/1994 | Riordan et al. ............... | 375/107 |
| 5,734,877 A * | 3/1998 | Ries et al. .................... | 395/555 |
| 5,835,424 A * | 11/1998 | Kikukawa et al. ............ | 365/200 |
| 5,849,610 A * | 12/1998 | Zhu ............................. | 438/129 |
| 5,881,019 A * | 3/1999 | Koshikawa ................... | 365/233 |
| 5,903,176 A * | 5/1999 | Westgate ...................... | 327/295 |
| 5,969,551 A * | 10/1999 | Fujioka ......................... | 327/149 |
| 6,075,393 A * | 6/2000 | Tomita et al. ................. | 327/153 |
| 6,154,080 A * | 11/2000 | Koshikawa ................... | 327/291 |
| 6,236,251 B1 * | 5/2001 | Akamatsu ..................... | 327/144 |
| 6,242,954 B1 * | 6/2001 | Taniguchi et al. ............ | 327/149 |
| 6,259,288 B1 * | 7/2001 | Nishimura .................... | 327/156 |
| 6,351,166 B2 * | 2/2002 | Hashimoto .................... | 327/158 |

* cited by examiner

*Primary Examiner*—N. Drew Richards
*Assistant Examiner*—Hai L. Nguyen
(74) *Attorney, Agent, or Firm*—Arent Fox LLP

(57) ABSTRACT

A module includes a semiconductor device, a phase adjustment circuit generating a second clock so that a phase adjustment signal output from the semiconductor device and a first clock have a predetermined phase relationship, and an output circuit that is provided in the semiconductor device and generates the phase adjustment signal from the second clock.

25 Claims, 21 Drawing Sheets

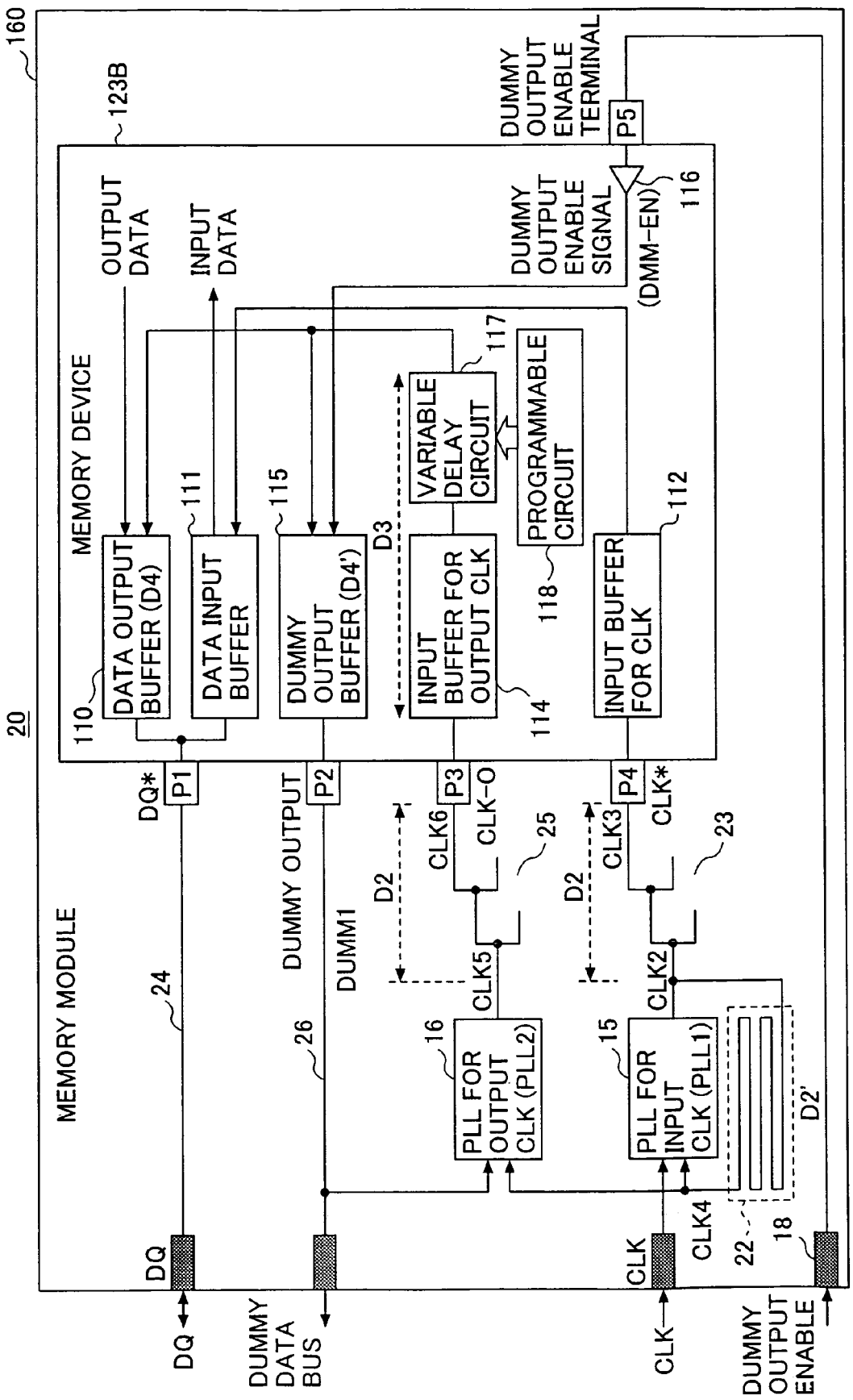

SEMICONDUCTOR PHASE ADJUSTMENT SYSTEM MODULE

BACKGROUND OF THE INVENTION

1. Field of the Invention

The present invention relates to modules having semiconductor devices mounted on a wiring or circuit board, and more particularly to a technique directed to making an arrangement in which data can be output from the semiconductor devices at the same timing as an external clock.

2. Description of the Related Art

Conventionally, a module is formed by mounting a plurality of semiconductor devices on a circuit device. For example, a memory module is formed by mounting a plurality of semiconductor memory devices on a wiring board (which may be referred to as a circuit board).

FIG. 1 is a block diagram of a conventional memory module (first conventional example). A memory module 10 shown in FIG. 1 includes a wiring board 150, in which provided are semiconductor memory devices 100 through 107, a PLL (Phase-Locked Loop) circuit 11, and a plurality of data input/output terminals DA and a clock input terminal respectively provided for the memory devices 100 through 107. The memory module 10 inputs and outputs parallel data consisting of a plurality of bits via the data input/output terminals DQ, and receives an external clock via the clock input terminal CLK.

The memory devices 100 through 107 input and output data signals DQ via data input/output terminals DQ* connected to the data input/output terminals DQ.

The clock supplied from the outside of the memory module 10 is applied to the PLL circuit 11 via the clock input terminal CLK. A clock output by the PLL circuit 11 is supplied to clock input terminals CLK* of the memory devices 100 through 107. The PLL circuit 11 is used to operate the memory module 10 in synchronism with a high-speed clock. If the external clock is supplied directly to the memory devices 100 through 107, the clock waveform will be rounded due to the parasitic capacitance coupled to clock supply lines extending from the clock input terminal CLK to the memory devices 100 through 107. The rounded clock waveform would prevent the memory devices 100 through 107 from operating at high speed. As an increased number of memory devices 100 through 107 is used, the clock waveform will be rounded more greatly. The PLL circuit 11 acts to reduce the parasitic capacitance of the clock supply lines and enhance the driving ability of the clock, so that the highly precise clock can be supplied to the memory devices 100 through 107. If the clock supply lines that extend from the PLL circuit 11 to the memory devices 100 through 107 are arranged so as to have an identical length, the input timings of the clocks obtained at clock input terminals CLK* of the memory devices 100-107 will coincide with one another.

FIG. 2 is a block diagram of the periphery of the PLL circuit 11 mounted on the wiring board 150 of the memory module 10, and the internal structure of the memory device 100 also mounted thereon. FIG. 3 is a timing chart of an operation of the memory module 10. Although only the memory device 100 is illustrated in FIGS. 2 and 3, the other memory devices 101 through 107 are configured as the memory device 100, and operate in the same manner as the same.

The memory module 10 is configured so that the timing relationship of the signals applied to its data input/output terminals DQ and clock input terminal CLK can be maintained at the data input/output terminals DQ* and clock input terminals CLK* of the memory devices 100 through 107. The external clock is supplied to the PLL circuit 11 as clock CLK1 via the clock input terminal CLK and a delay circuit 21. A clock CLK2, that is output by the PLL circuit 11, is supplied, as clock CLK3, to the clock input terminal CLK* of the memory device 100 via a clock supply line 23 having a tree-like structure, and is fed back, as a clock CLK4, to the input side of the PLL circuit 11 via a delay line 22. The PLL circuit 11 controls the phase (output timing) of the clock CLK2 so that the clocks CLK1 and CLK4 are in phase.

The delay circuit 21 has a meander wiring pattern, which has a delay time (delay amount) D1' that is substantially equal to a delay time (delay amount) D1 of a data line (data bus) 24 for connecting the data input/output terminal DQ of the memory module 150 and the data input/output terminal DQ* of the memory device 100. The delay circuit 22 has a meander wiring pattern, which has a delay time (delay amount) D2' that is substantially equal to a delay time (delay amount) D2 of a clock supply line 23. The PLL circuit 11 adjusts the phase of the clock CLK2 so that the clocks CLK1 and CLK4 are in phase with each other. As a result of the above phase control, the timing relationship of the signals applied to the data input/output terminal DQ and the clock input terminal CLK is also maintained at the data input/output terminal DQ* and clock input terminal CLK* of the memory device 100.

The memory device 100 includes a data output buffer 110, a data input buffer 111, a clock input buffer 112, and a DLL (Delay-Locked Loop) circuit 113 for outputting a clock. The DLL circuit 113 may be replaced by a PLL circuit. The clock CLK3 applied to the clock input terminal CLK* is supplied to the data input buffer 111 and the DLL circuit 113 via the input buffer 112. The data input buffer 111 fetches input data applied to the data input/output terminal DQ* in synchronism with the clock CLK3 available via the input buffer 112. The DLL circuit 113 supplies the data output buffer 110 with a clock CLK10 for data outputting. The clock CLK10 can be obtained by delaying the clock CLK3. By setting the delay time between the clock CLK3 and the clock CLK10 appropriately, the memory device 100 can output data to the data input/output terminal DQ* at the same timing as the clock CLK3. That is, the clock CLK10 leads to the clock CLK3 applied to the clock input terminal CLK* by a delay D4 of the data output buffer 110.

In the memory module thus configured, as shown in FIG. 3, data output to the data input/output terminal lags behind the clock CLK applied to the clock input terminal CLK by D1×2.

FIG. 4 is a block diagram of another conventional memory module (second conventional module) that has a different configuration from the first conventional memory module. A memory module 12 shown in FIG. 4 has a unique arrangement that makes it possible to operate at a higher speed than that in the memory module 10. More particularly, the data input/output terminals DQ of the memory module 12 and the data input/output terminals DQ* are arranged as close as possible. The PLL circuit 11 is arranged so as to split memory devices 100A through 107A into two groups. The clock supply line 23 from the PLL circuit 11 is arranged in a tree fashion on the side of the wiring board 150 opposite to that on which the data input/output terminals DQ are provided. The data input/output terminals DQ* and clock input terminals CLK* of the memory modules 100A through 107A are arranged on the opposite sides of the chips. This terminal arrangement is different from that of the memory modules 100 through 107.

FIG. 5 is a block diagram of the periphery of the PLL circuit 11 mounted on the wiring board 150 of the memory module 12, and the internal structure of the memory device 101A also mounted thereon. For the sake of convenience, the data input/output terminal DQ* and the clock input terminal CLK* are arranged on the same side of the memory device 100A. FIG. 6 is a timing chart of an operation of the memory module 12 shown in FIG. 5. Although only the memory device 100A is illustrated in FIGS. 5 and 6, the other memory devices 101A through 107A are configured as the memory device 100A, and operate in the same manner as the same.

In FIG. 5, the data lines 24 are too short to cause a substantial delay. Hence, the clock input terminal CLK and the PLL circuit 11 are connected directly. In the data outputting operation, the output data DQ at the data input/output terminal DQ is in phase with the external clock at the clock input terminal CLK. In contrast, in the memory module 10, the output data DQ is delayed so as to lag behind the clock at the clock input terminal CLK by the delay D1×2, as has been described previously.

The data are output from the memory devices 100 through 107 mounted on the memory module 10 at the timings adjusted by the DLL (or PLL) circuit 113 also mounted thereon. The DLL 113 needs a stable power source in order to perform highly precise timing adjustment. However, the DLL circuit 113 is provided in each of the memory devices 100 through 107, and is therefore affected by noise superimposed on a power supply thereto. This will cause an error in timing adjustment and a jitter between the phase of the clock and that of the output data.

The above drawbacks occur in the memory module 12 as well.

SUMMARY OF THE INVENTION

It is an object of the present invention to eliminate the above drawbacks.

A more specific object of the present invention is to provide a module in which output data and a clock can be accurately synchronized with each other without being affected by noise superimposed on a power supply thereto, and to provide a semiconductor module that can be mounted on a module as described above, and a system that employ a plurality of modules each being configured as described above.

The above objects of the present invention are achieved by a module comprising: a semiconductor device; a phase adjustment circuit generating a second clock so that a phase adjustment signal output from the semiconductor device and a first clock have a predetermined phase relationship; and an output circuit that is provided in the semiconductor device and generates the phase adjustment signal from the second clock. The phase adjustment circuit is provided separate from or outside of the semiconductor device. Thus, even if noise is superimposed on a power source supplied to the semiconductor device, the phase adjustment circuit is not affected by the noise at all and can operate normally. The second clock thus generated makes it possible to output data precisely in synchronism with the second clock.

The above objects of the present invention are also achieved by a module comprising: semiconductor devices; a phase adjustment circuit generating a second clock so that a phase adjustment signal output from a first semiconductor device that is one of the semiconductor devices and a first clock have a predetermined phase relationship, the second clock being supplied to the semiconductor devices; and a wiring board on which the semiconductor devices and the phase adjustment circuit are mounted, the first semiconductor device including an output circuit generating the phase adjustment signal from the second clock.

The above objects of the present invention are also achieved by a system comprising: modules; a wiring board on which the modules are mounted; and a dummy output load line serving as loads of dummy output data output from the modules.

The above objects of the present invention are also achieved by a semiconductor device comprising: a first buffer receiving a first external clock and generating a first internal clock therefrom; a second buffer receiving a second external clock and generating a second internal clock therefrom; an input buffer fetching input data in synchronism with the first internal clock; an output buffer from which data is output in synchronism with the second internal clock; and an output circuit outputting dummy output data in synchronism with the second internal clock.

BRIEF DESCRIPTION OF THE DRAWINGS

Other objects, features and advantages of the present invention will become more apparent from the following detailed description when read in conjunction with the accompanying drawings, in which:

FIG. 21 is a block diagram of an overall structure of a memory module according to a fourth embodiment of the present invention.

DESCRIPTION OF THE PREFERRED EMBODIMENTS

Figure 7:
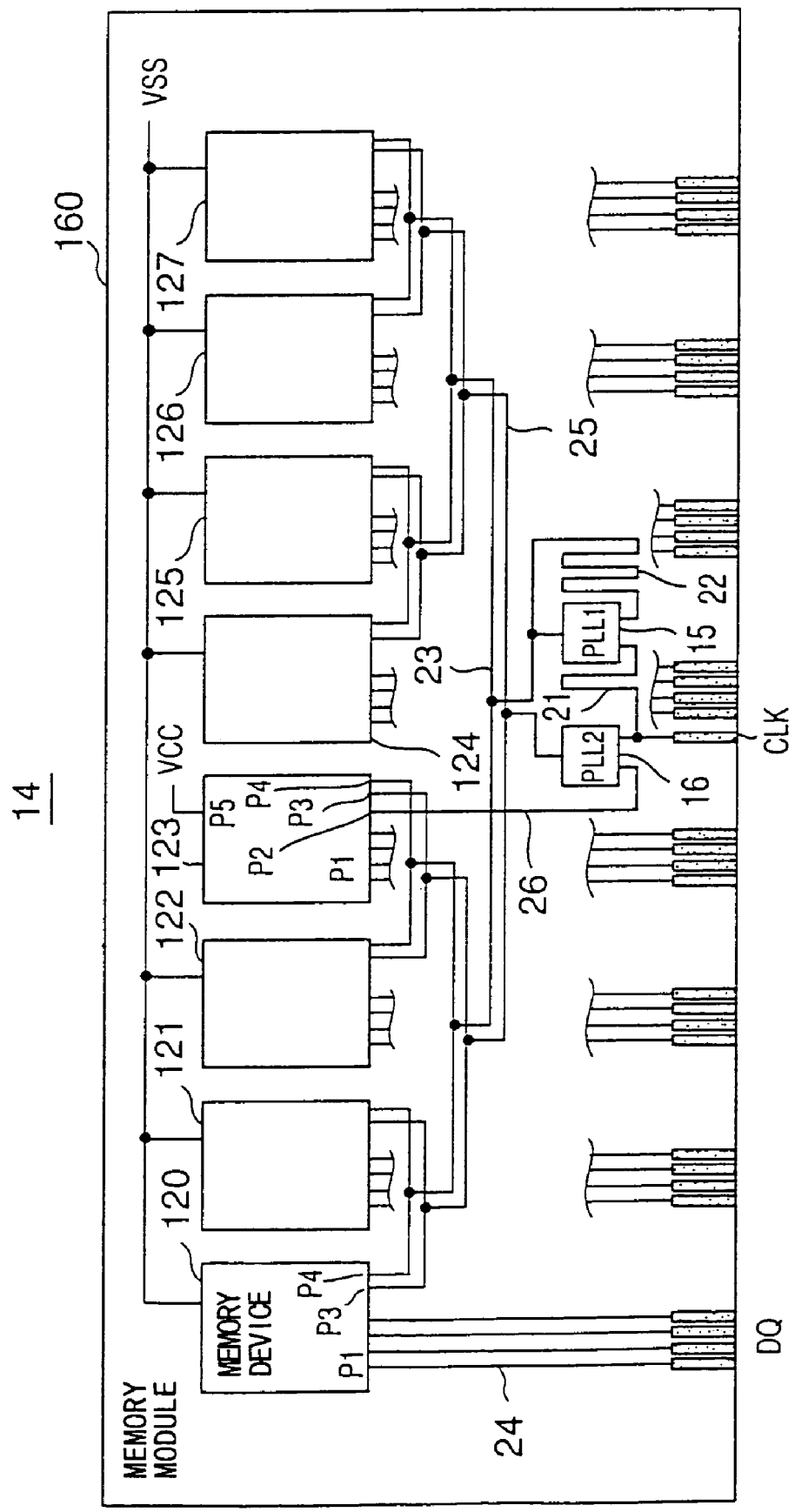
FIG. 7 is a block diagram of an overall structure of a memory module according to a first embodiment of the present invention.

FIG. 7 is a block diagram of a module according to a first embodiment of the present invention. A memory module 14 shown in FIG. 7 includes, on a wiring board 160, memory devices 120-127 having an identical structure, a PLL circuit (PLL1) 15 for an input clock, a PLL circuit (PLL2) 16 for an output clock, data input/output terminals DQ and a clock input terminal CLK. A positive power source voltage VCC is applied, as an external instruction signal, to a dummy output enable terminal of the memory device 123. The remaining memory modules 120-122 and 124-127 are supplied with a negative power source voltage (ground voltage) VSS via the respective dummy output enable terminal. Thus, only the memory device 123 is allowed to generate dummy output data, which will be described later. In the specification, clocks handled within the module are internal clocks.

The data input/output terminals DQ of the memory module 14 are provided respectively for the memory devices 120 through 127, and are connected to data input/output terminals P1 thereof.

The clock input terminal CLK, to which an external clock is applied, is connected to inputs of the PLL circuits 15 and 16. The PLL circuit 15 acts as a phase adjustment circuit, and outputs a clock for data inputting to clock input terminals P4 of the memory devices 120 through 127 via the clock supply line 23. The PLL circuit 16 acts as a phase adjustment circuit, and outputs a clock used to output data to clock terminals P3 of the memory devices 120 through 127 via a clock supply line 25. The clock supply lines 23 and 25 have a substantially identical delay amount. The term "substantially" means that the delay amounts of the lines 23 and 25 have a tolerable difference, which may depend on the user's requirement, for example. The clock supply lines 23 and 25 may have an identical length.

The PLL circuit 16 receives dummy output data, which is output from the memory device 123 via the dummy output terminal P2. Then, the PLL circuit 16 compares the phase of the dummy output data with that of the external clock. As will be described later, the memory device 123 is capable of generating dummy output data from the clock received via the dummy data output terminal P2. The timing of the clock used to output data is adjusted by the PLL circuit 16 so that the dummy output data and the external clock are pulled in phase. If the dummy output data has the same delay amount as the data output signal lines 24, the dummy output data and the output data at the data input/output terminal DQ are in phase. That is, the output data at the data input/output terminal DQ is synchronized with the external clock. In that manner, the dummy output data functions as a phase adjustment signal.

Figure 8:
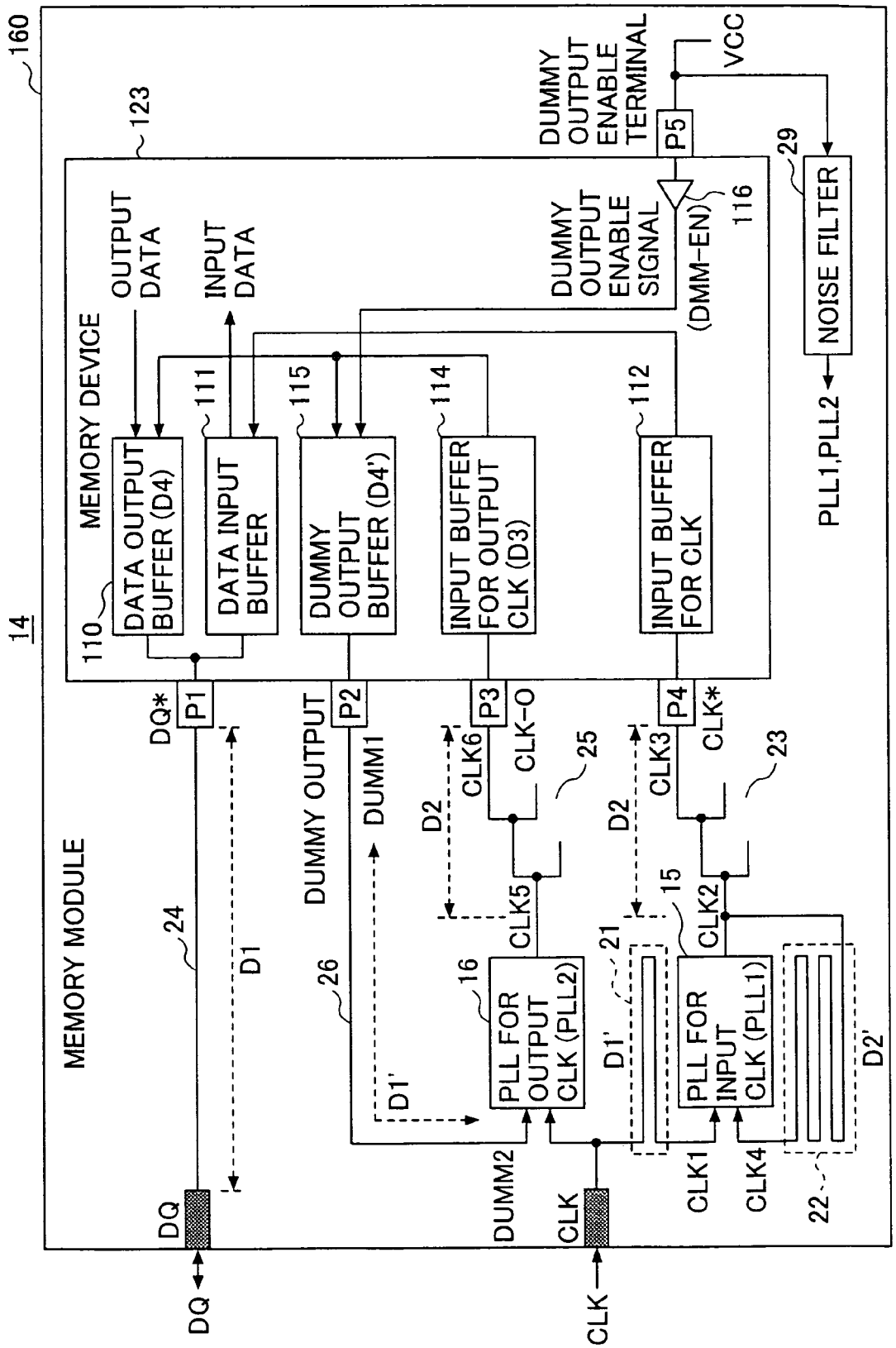
FIG. 8 is a block diagram of a circuit configuration of the memory module according to the first embodiment of the present invention.
Figure 9:
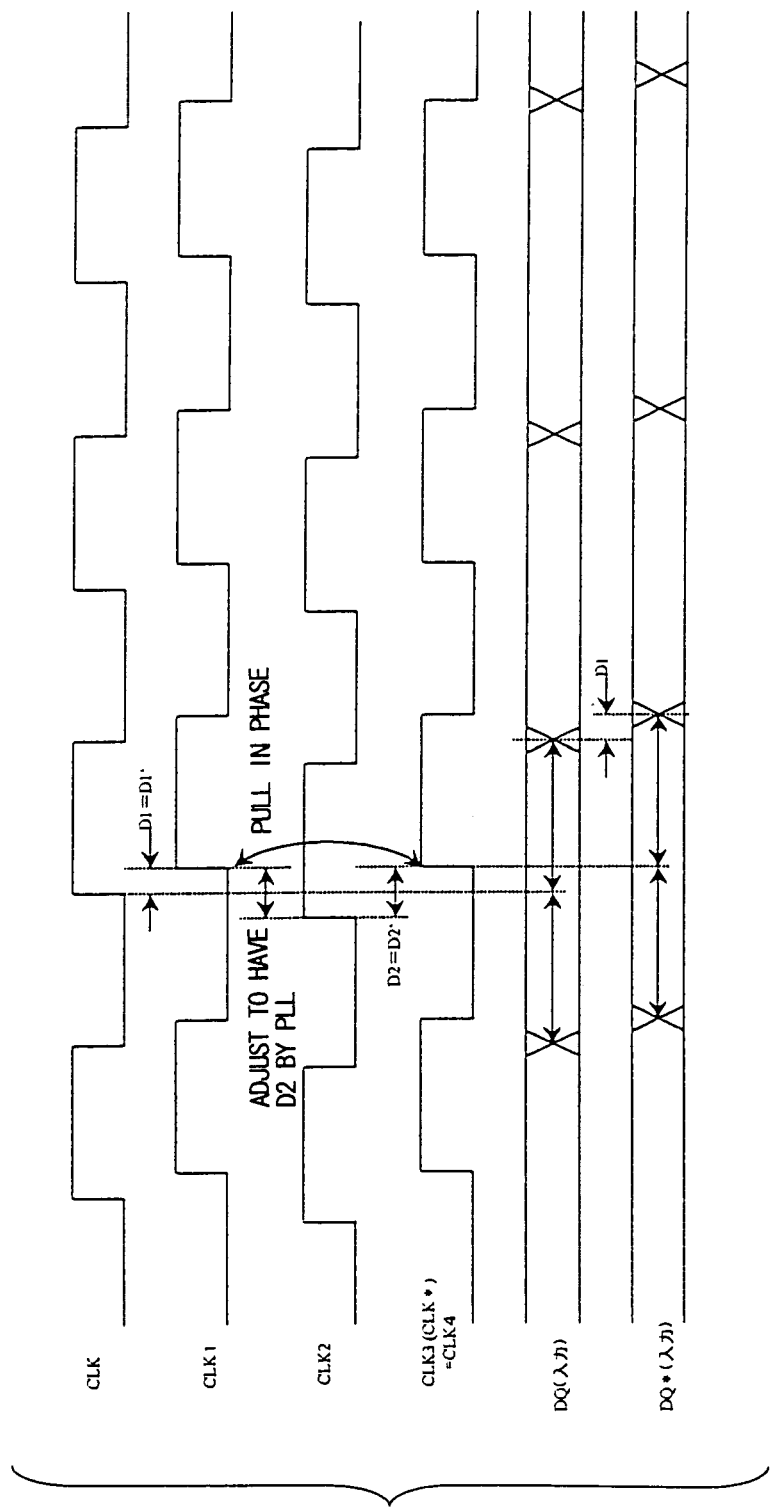
FIG. 9 is a timing chart of an operation of the memory module according to the first embodiment of the present invention performed at the time of inputting data.
Figure 10:
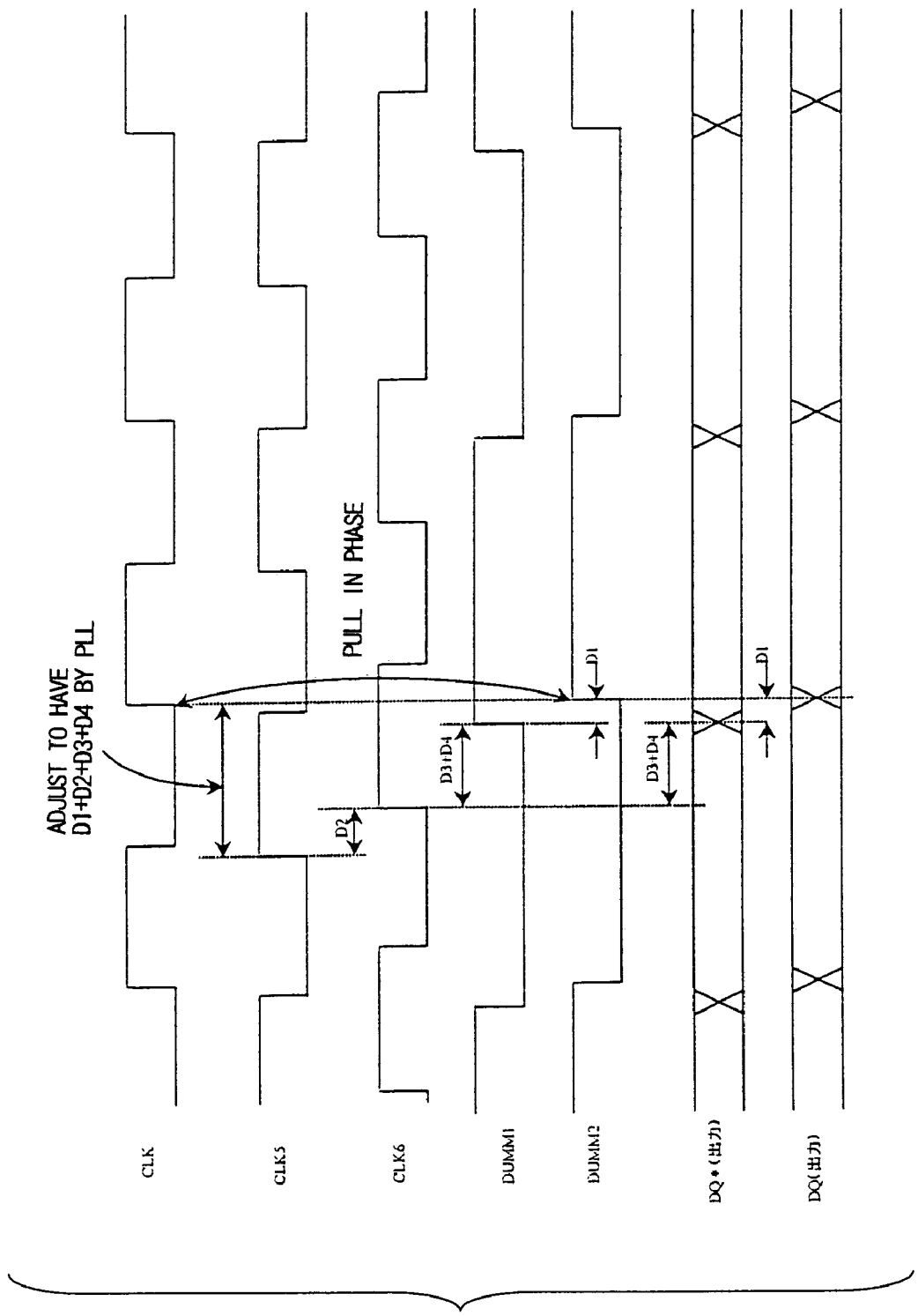
FIG. 10 is a timing chart of an operation of the memory module according to the first embodiment of the present invention performed at the time of outputting data.

FIG. 8 is a block diagram illustrating circuit configurations of the peripheries of the PLL circuits 15 and 16 and the memory device 123 mounted on the memory module 14. FIG. 9 is a timing chart of an operation of the structure shown in FIG. 8 at the time of inputting data. FIG. 10 is a timing chart of an operation of the structure shown in FIG. 8 at the time of outputting data.

The data input/output terminal DQ of the memory module 14 is connected to the data input/output terminal DQ*(P1) of the memory device 123 via the data lines 24. The clock input terminal CLK of the memory module 14 is connected to an end of the delay circuit 21 and one of the two inputs of the PLL circuit 16 used to output the clock. The PLL circuit 5 used to input the clock, the delay circuit 21, the delay circuit 22 and the clock supply line 23 are the same as those of the aforementioned memory module 10. At the time of inputting data, as shown in FIG. 9, the PLL circuit 15 controls the timing of the output clock CLK2 so that there is no phase difference between the clock CLK1 received via the delay circuit 21 and the clock CLK4 from the delay circuit 22. The clock CLK2 is applied to the clock input terminal CLK* (P4) of the memory device 123 via the clock supply line 23. The delay time D1' of the delay circuit 21 is substantially equal to the delay time D1 of the data lines 24, and the delay time D2' of the delay circuit 22 is substantially equal to the delay time D2 of the clock supply line 23.

A description will be given, with reference to FIG. 10, of a structure and an operation related to the data outputting. The PLL circuit 16 that generates the clock used to output data receives the dummy output data via the dummy output data line 26, and compares the phase of the dummy output data with that of the external clock CLK. The clock CLK5 output by the PLL circuit 16 is supplied, as clock CLK6, to a clock input terminal CLK-O (P3) of the memory device 123 via the clock supply line 25.

Figure 1:
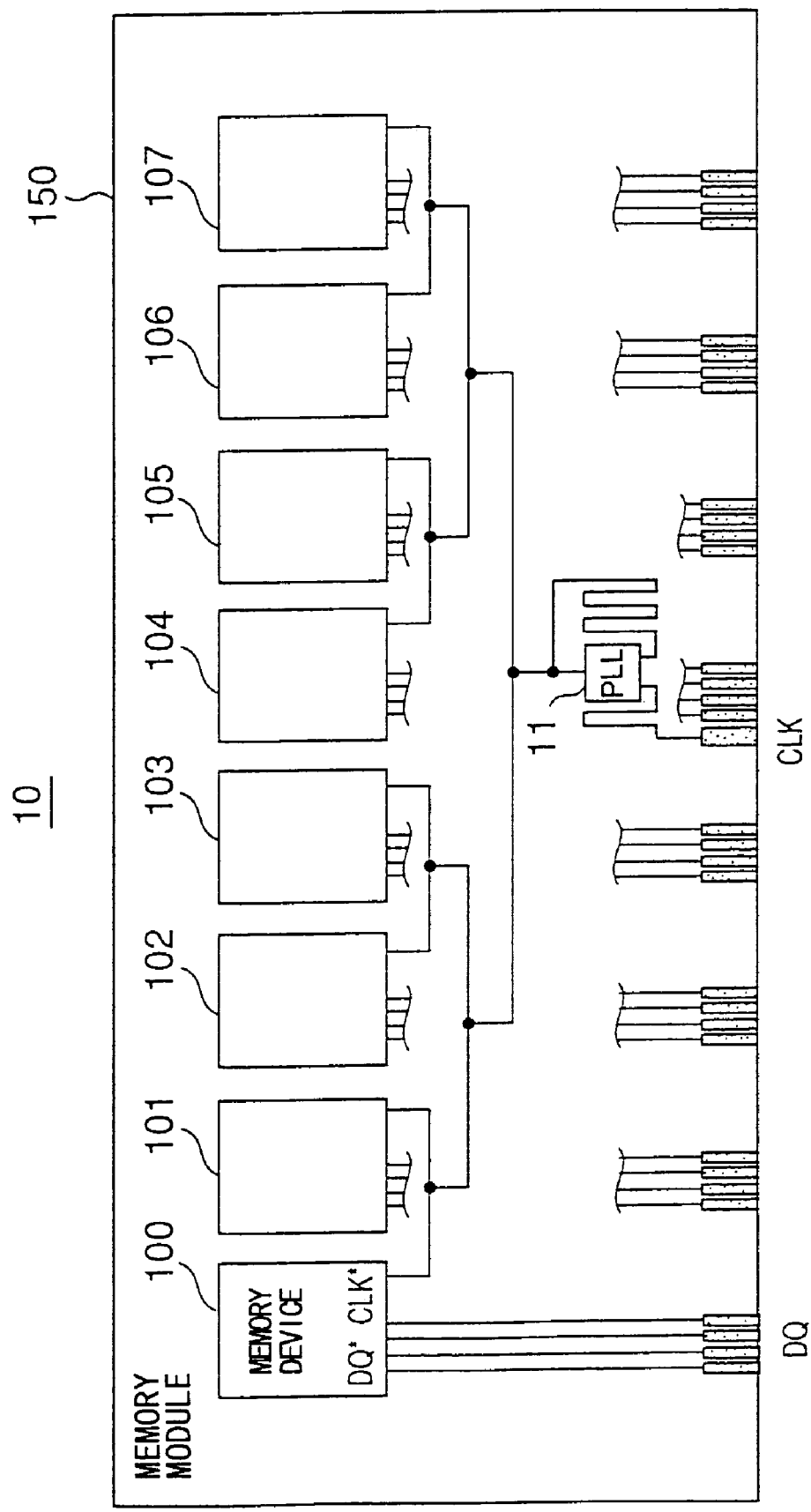
FIG. 1 is a block diagram of a first conventional memory module.
Figure 2:
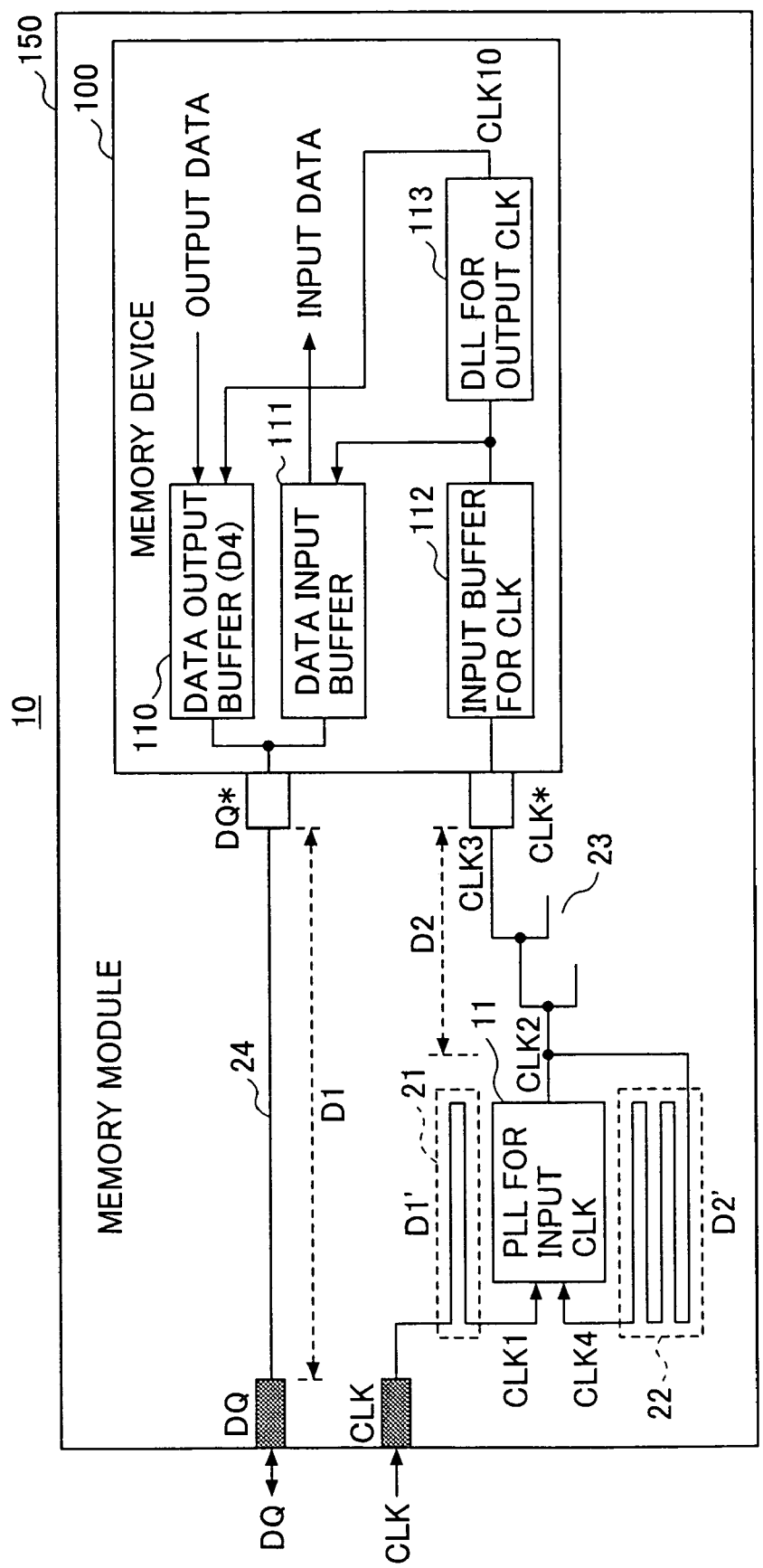
FIG. 2 is a block diagram of a circuit configuration of the memory module shown in FIG. 1.
Figure 3:
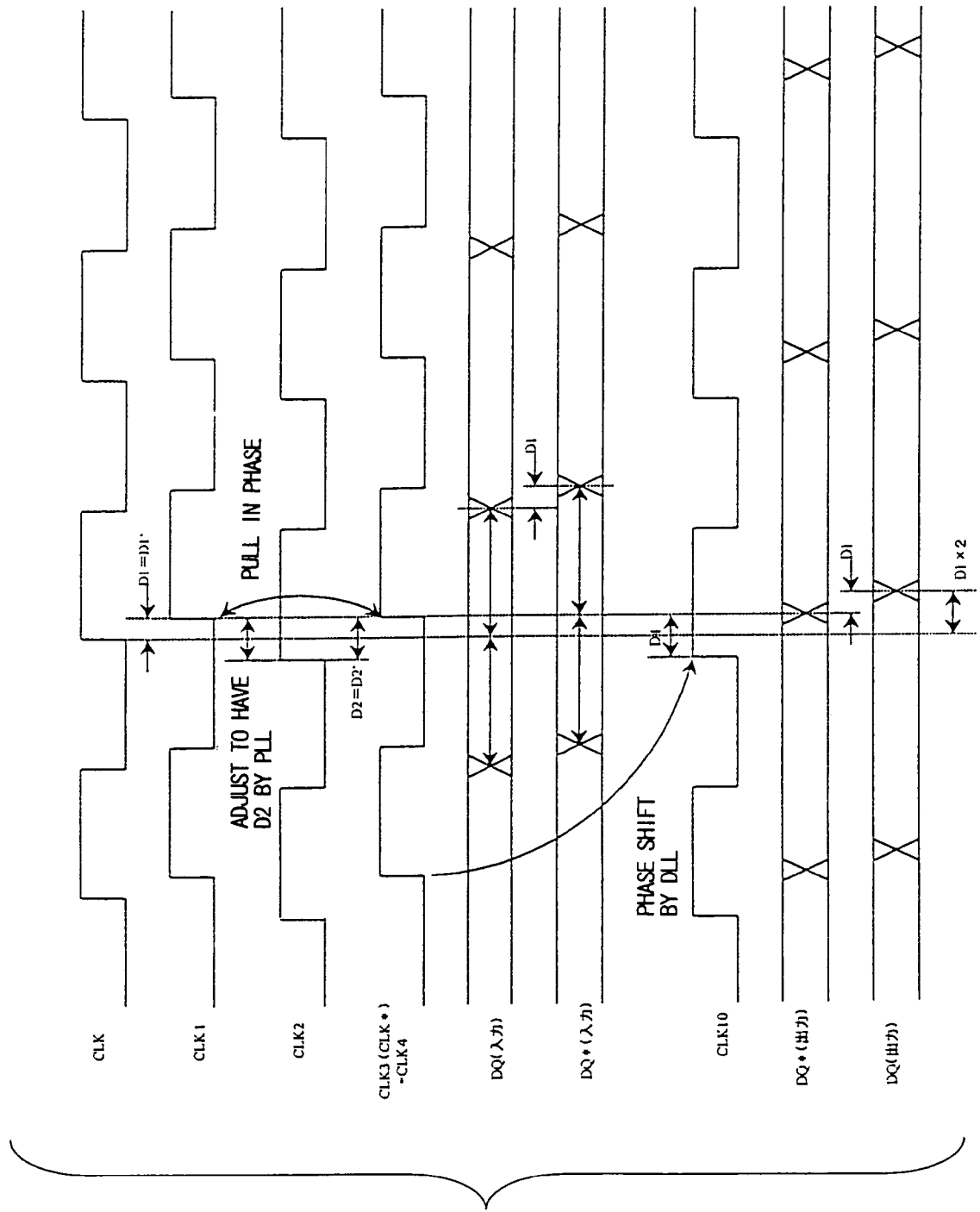
FIG. 3 is a timing chart of an operation of the memory module shown in FIGS. 1 and 2.
Figure 4:
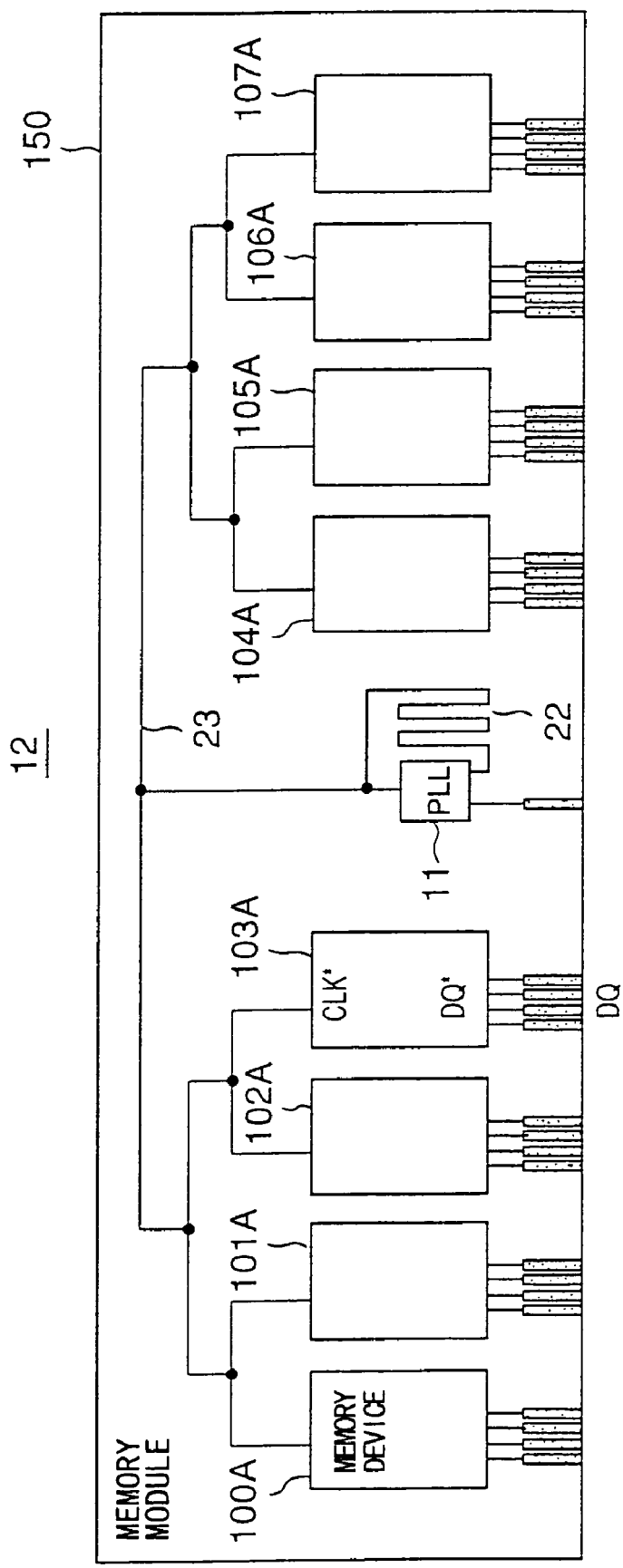
FIG. 4 is a block diagram of a second conventional memory module.
Figure 5:
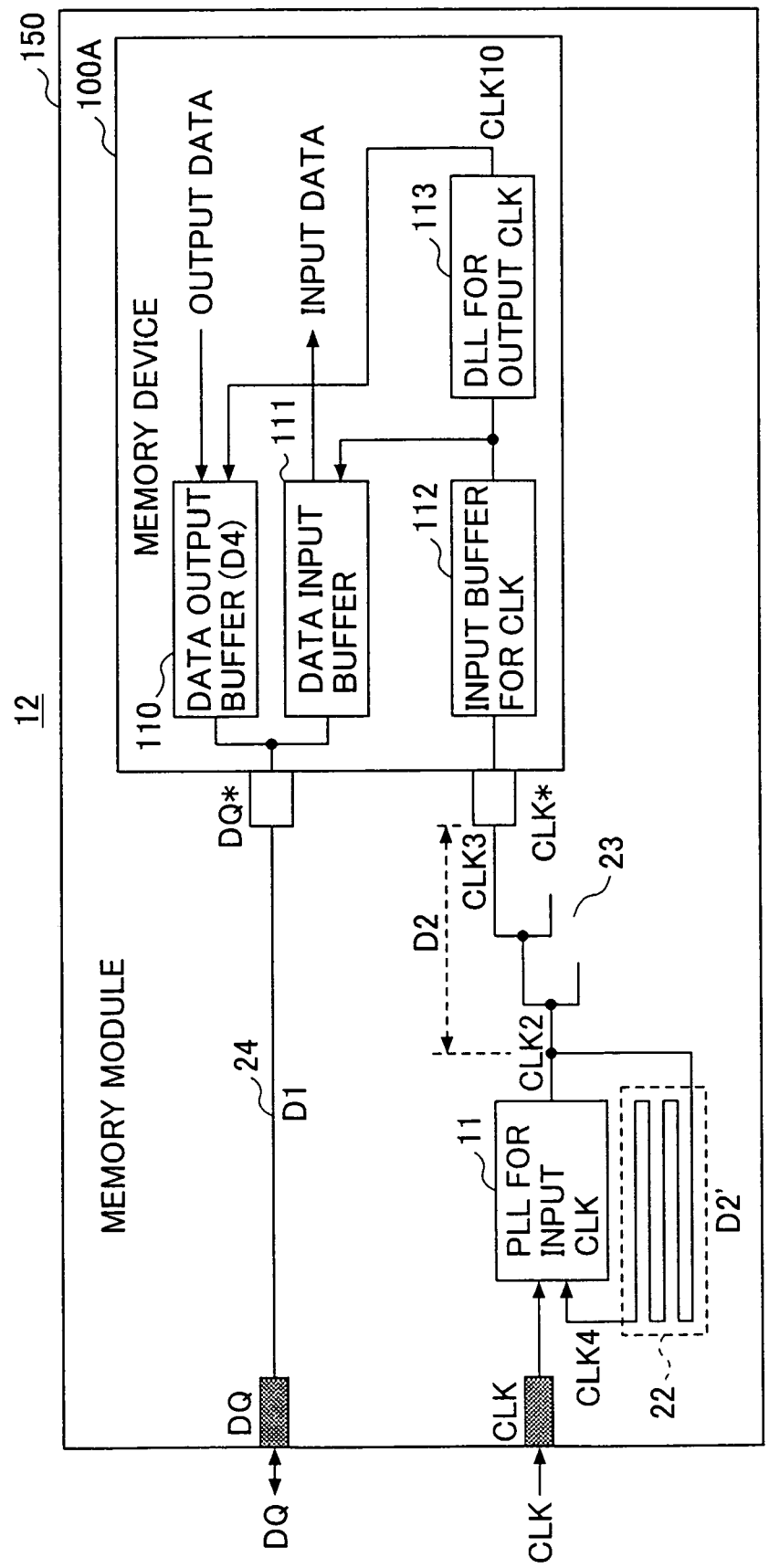
FIG. 5 is a block diagram of a circuit configuration of the memory module shown in FIG. 4.

The memory device 123 includes an input buffer 114 for the output clock, a dummy output buffer 115, a buffer 116 and an dummy output enable terminal P5 in addition to the aforementioned data output buffer 110, the data input buffer 111, and the input buffer 112 that receives the clock used to input data. The memory device 123 does not have the DLL circuit 113 for the output clock shown in FIGS. 2 and 5. The input buffer 114 buffers the clock CLK6 applied to the clock input terminal P3, and outputs the buffered clock to the data output buffer 110 and the dummy output buffer 115. The dummy output buffer 115 is supplied with the power source voltage VCC via the dummy output enable terminal P5 and the buffer 116. The output signal of the buffer 116 functions as a dummy output enable signal DMM-EN, and the dummy output buffer 115 is set to an enable state. The enable state may be set by applying the dummy output enable signal DMM-EN to the gate of a transistor (switch) which turns ON/OFF the power source voltage VCC supplied to the dummy output buffer 115. The dummy output buffer 115 buffers the received clock, and applies the buffered clock to the dummy output terminal P2. The dummy output buffer 115 has delay time D4' substantially equal to the delay time D4 of the data output buffer 110. When the delay time of the input buffer 114 for the output clock is denoted as D3, the clock CK6 is delayed by D3+D4' and is output to the dummy output terminal P2 as dummy output data DUMM1.

The dummy output data DUMM1 is applied to the PLL circuit 16 for the output clock as dummy output data DUMM2. The dummy output data line 26 has delay time D1'. The PLL circuit 16 compares the phase of the external clock CLK with that of the dummy output data DUMM2, and controls the timing of the output clock CLK5 so that the phase difference becomes zero. The clock input terminal CLK and the PLL circuit 16 is close so that a delay time caused by the wiring line connecting them is negligible. The clock CLK5 travels through the clock supply line 25, the input buffer 114, the dummy output buffer 115 and the dummy output data line 26, so that it is delayed by D2+D3+D4'+D1' (=D1+D2+D3+D4). The situation in which the dummy output data DUMM2 and the external clock CLK are in phase means that the external clock CLK and the data signal at the data input/output terminal DQ are in phase.

The clock CLK5 thus controlled is supplied to the memory devices 120 through 127 via the clock supply lines of the equal length. Hence, the items of data output from the memory devices 120 through 127 are in phase with the external clock CLK at the data input/output terminals DQ of the memory module 14. Thus, data can be output via the data input/output terminals DQ in synchronism with the external clock CLK. The power source voltage VSS is supplied to the dummy output enable signals P5 of the memory devices 120-123 and 124-127 other than the memory device 124. Thus, the dummy output buffers 115 of the memory devices except the memory device 124 are set in the disable state, and dummy output data are not output therefrom.

As described above, the timing adjustment of data outputting is carried out by the PLL circuit 16 for the output clock mounted on the wiring board 160 of the memory module 14. This avoids the necessity of the DLL circuits mounted to the memory devices 120 through 127. Even if nose is superimposed on the power sources of the memory devices 120 through 127, the timing adjustment of the data outputting is not affected at all. In addition, as shown in FIG. 8, a noise filter 29 may be used to eliminate noise superimposed on the power source voltage VCC and supply noise-eliminated power supply voltage to the PLL circuits 15 and 16. It is therefore possible to implement more reliable timing control. The noise filter 29 may be a conventional filter capable of eliminating noise from a power source.

Figure 11:
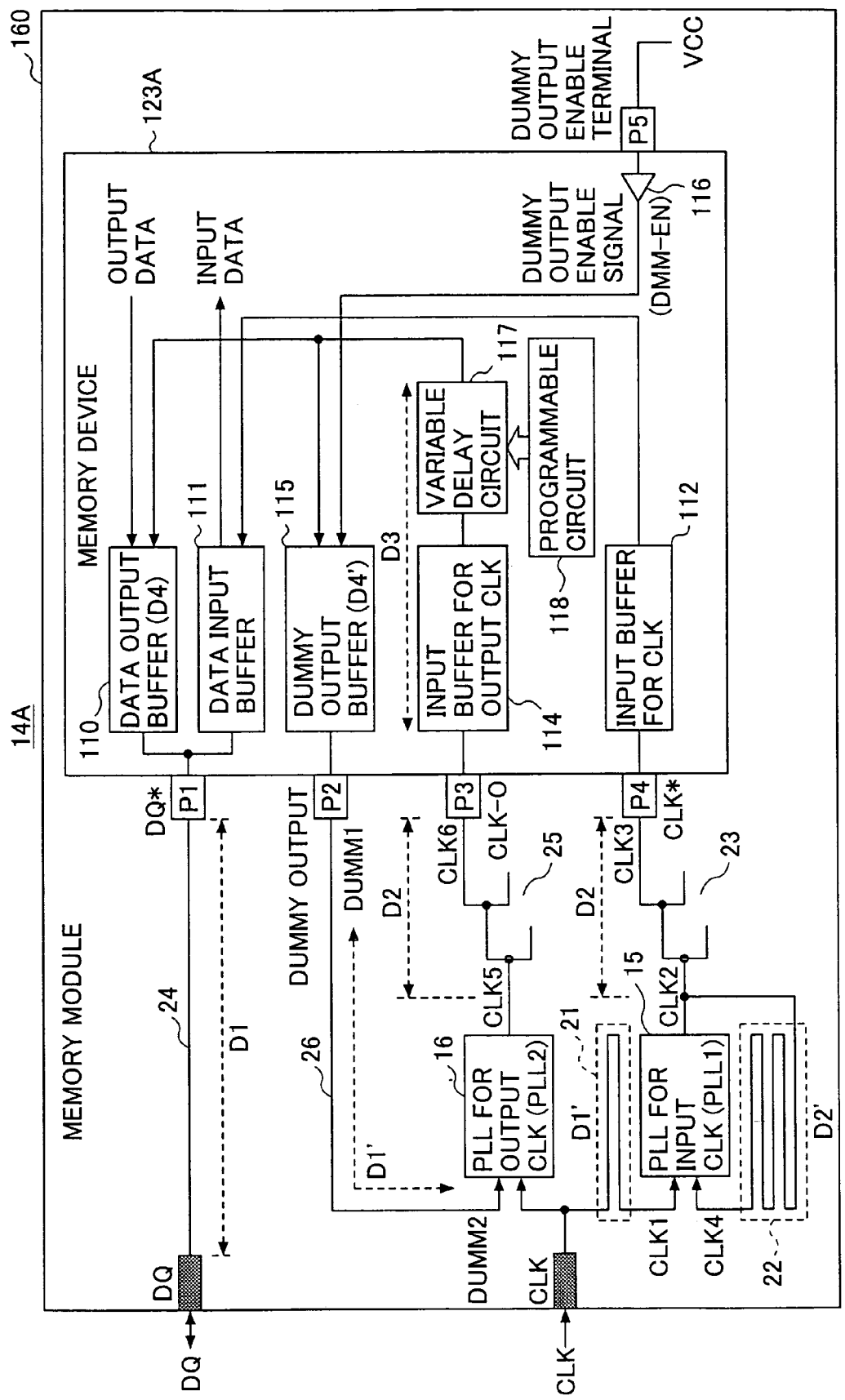
FIG. 11 is a block diagram of a variation of the circuit configuration shown in FIG. 8.

FIG. 11 is a block diagram of a circuit configuration of a memory module 14A, which is a variation of the first embodiment of the present invention. In FIG. 11, parts that are the same as those shown in FIG. 8 are given the same reference numerals.

A memory device 123A corresponds to the memory device 123 shown in FIG. 8, and includes a variable delay circuit 117 and a programmable circuit 118. The variable delay circuit 117 delays the output of the input buffer 114 for the output clock by a delay time that is set by the programmable circuit 118. The delayed signal is then output to the data output buffer 110 and the dummy output buffer 115.

The variable delay circuit 117 and the programmable circuit 118 are used to compensate for differences of the delay times (such as D3 and D4') in different memory devices due to an unevenness of the fabrication process. The circuits 117 and 118 act to make the delay time between the clock input terminal P3 and the dummy output terminal P2 of each memory device contact. In wafer test or shipping test, the programmable circuit 118 is programmed so that the variable delay circuit 117 has a programmed correction value (delay time). The correction value makes the total delay time of the input buffer 114 and the variable delay circuit 118 substantially to D3. All the memory devices mounted on the memory module 14A are programmed so that the delay times between the clock input terminals P3 and the dummy output terminals P2 of the memory devices are substantially equal to each other. Thus, by carrying out the timing adjustment of the output clock using the aforementioned PLL circuit 16 in one of the memory devices mounted on the memory module 14A (for example, memory device 123A), the output timings of all the memory devices precisely coincide with each other. The data input operation and the data output operation are performed at the timings shown in FIGS. 9 and 10, respectively.

Figure 12:
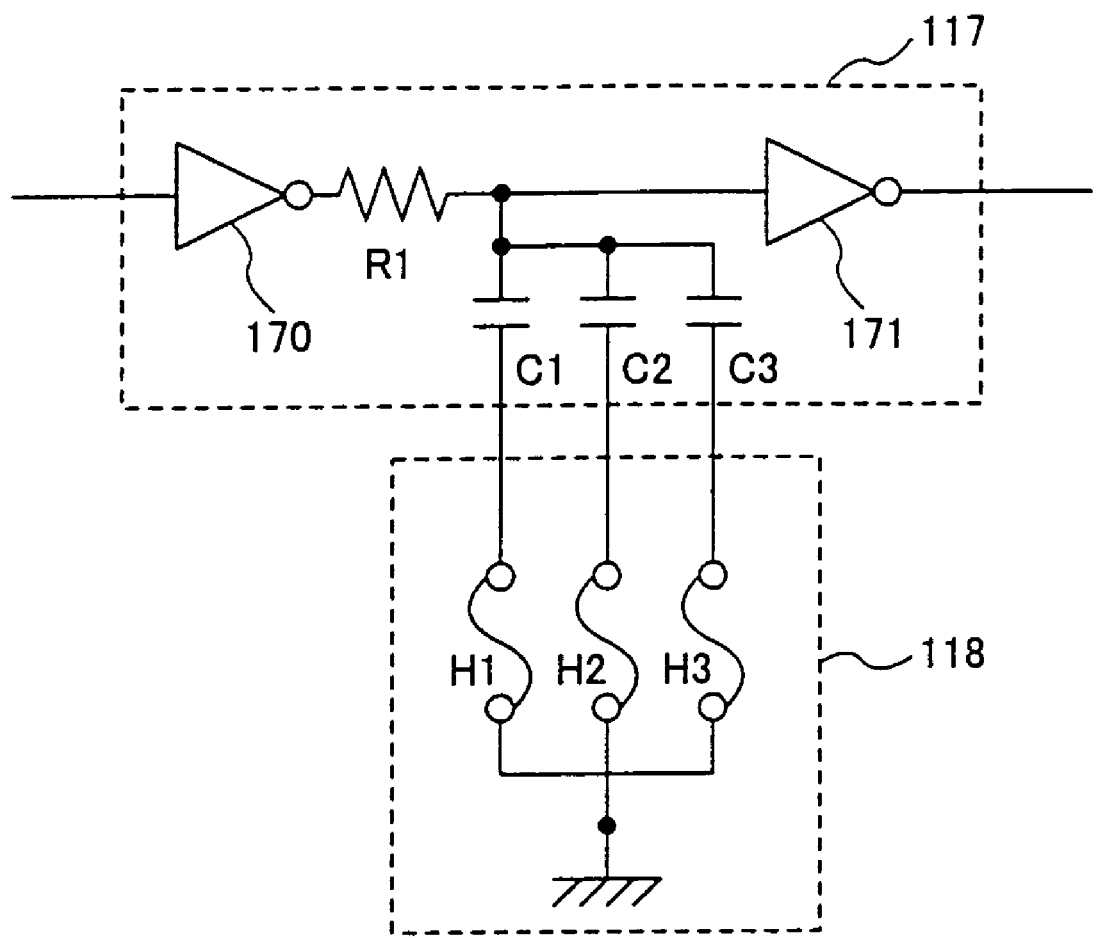
FIG. 12 is a circuit diagram of a circuit configuration of a programmable delay circuit and a programmable circuit shown in FIG. 11.

FIG. 12 is a circuit diagram of a circuit configuration of the variable delay circuit 117 and the programmable circuit 118 shown in FIG. 11. The variable delay circuit 117 includes inverters 170 and 171, a resistor R1 and capacitors C1, C2 and C3. One of the two ends the resistor R1 is connected to an output terminal of the inverter 170, and the other end is connected to an input terminal of the inverter 171 and ends of the capacitors C1 through C3. The programmable circuit 118 has fuses H1, H2 and H3, which are respectively connected to the capacitors C1, C2 and C3 and are grounded. Each of the fuses H1-H3 may be cut so that the above-mentioned correction value can be set.

Figure 13:
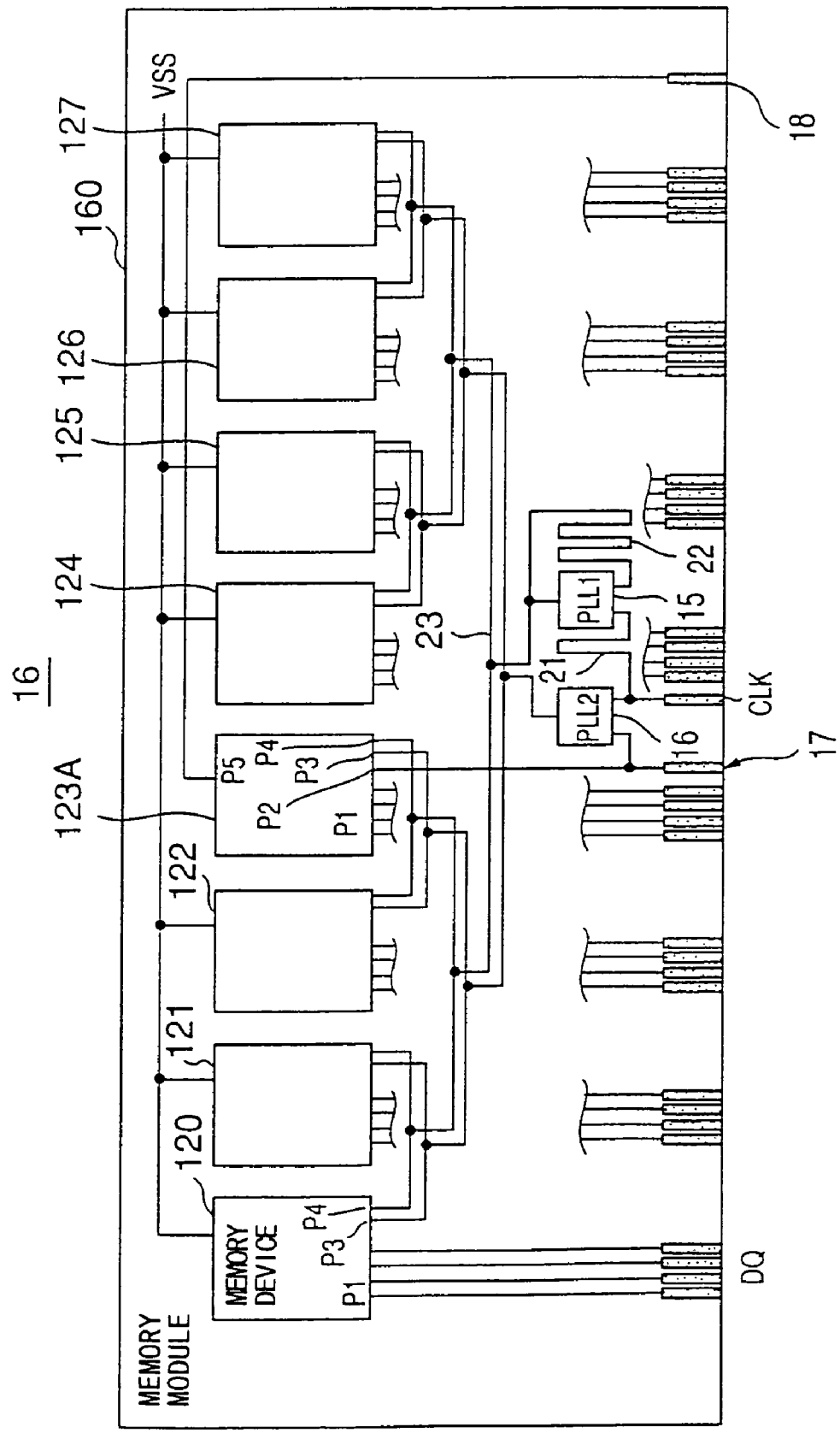
FIG. 13 is a block diagram of an overall structure of a memory module according to a second embodiment of the present invention.

FIG. 13 is a block diagram of a memory module 1600 according to a second embodiment of the present invention. Any part shown in the previously described figures that is the same as a part shown in FIG. 13 is denoted by the same reference numeral in these figures.

In the aforementioned variation of the first embodiment of the present invention, the data lines (data bus) 24 formed on the wiring board 160 are connected to the data input/output terminals DQ. In order to coincide the phase of the dummy output data with the data of the data input/output terminal DQ, a dummy output terminal 17 is preferably connected to the dummy output data line 26, as shown in FIG. 13. The same load as that connected to the data input/output terminal DQ can be connected to the dummy output terminal 17. Thus, the data line 24 and the dummy output data line 26 have the same load condition. It is not necessary to set the strictly identical condition. In other words, the data lines 24 and the dummy output lines 26 may have substantially the same load condition within a tolerable range that is determined by taking into consideration, for example, a condition in which the memory module is used. A dummy output enable terminal 18 connected to the terminal P5 of the memory device 123A is mounted on the wiring board 160. The power source voltage VCC may selectively be applied to the dummy output enable terminal 18.

Figure 14:
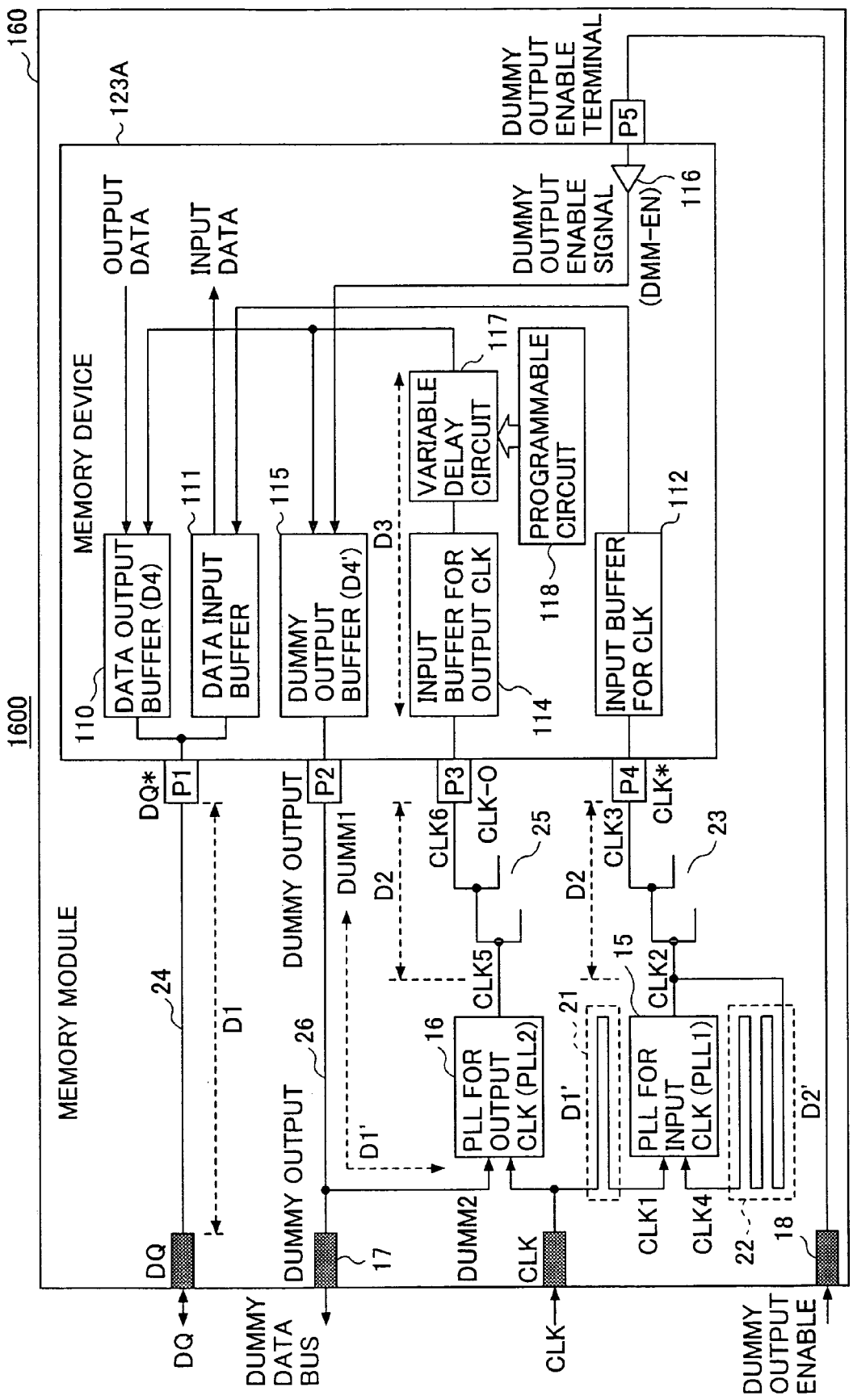
FIG. 14 is a block diagram of a circuit configuration of the memory module shown in FIG. 13.

FIG. 14 is a block diagram of the peripheries of the PLL circuits 15 and 16 and an internal circuit configuration of the memory device 123A mounted on the memory module 1600 shown in FIG. 13. The dummy output terminal 17 is connected to the dummy output terminal P2 and the PLL circuit 16. The length of the wiring line between the dummy output terminal 17 and the dummy output terminal P2 is substantially equal to that of the wiring line between the dummy output terminal P2 and the PLL circuit 16. In other words, the delay time between the dummy output terminal 17 and the dummy output terminal P2 is substantially equal to that between the dummy output terminal P2 and the PLL circuit 16.

A plurality of memory modules 1600 thus configured are mounted on a wiring board so that a memory system can be formed.

Figure 15:
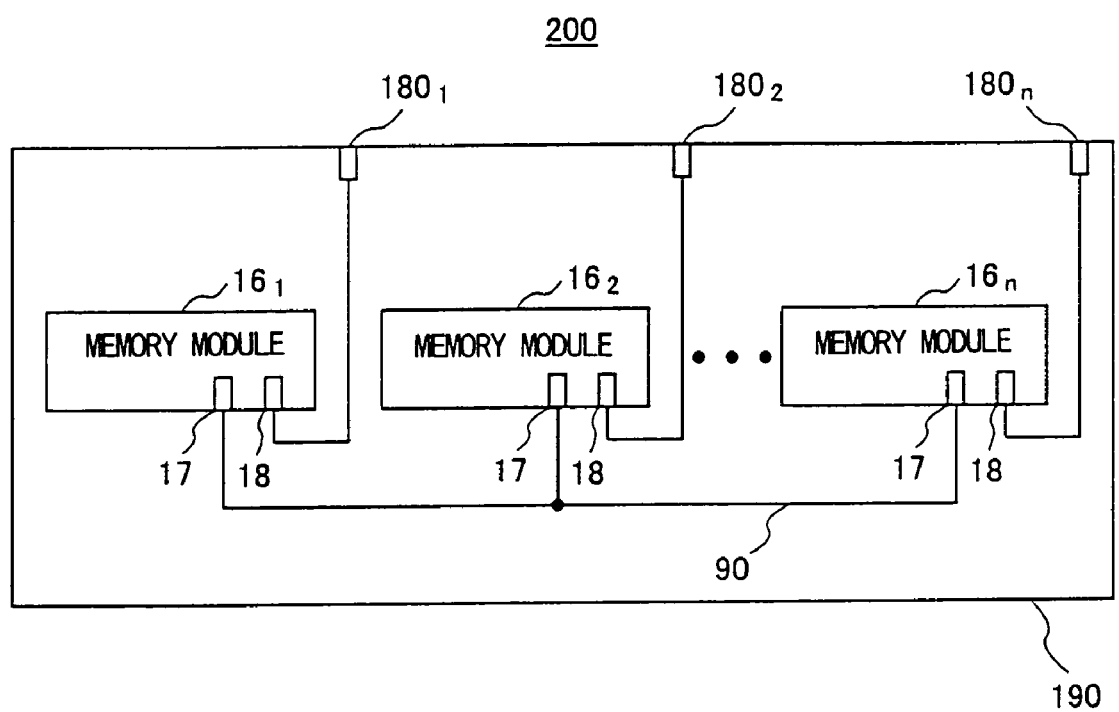
FIG. 15 is a block diagram of an overall structure of a memory system using memory modules configured according to the second embodiment of the present invention.

FIG. 15 is a block diagram of a memory system 200 in which a plurality of memory modules $16_1$ through $16_n$ (n is an integer) are mounted on a wiring board 190. Each of the memory modules $16_1$ through $16_n$ may be configured as shown in FIG. 14. The dummy output terminal 17 of each of the memory modules $16_1$ through $16_n$ is connected to a common dummy output load line (data bus) 90 formed on the wiring board 190. The dummy output enable terminals 18 of the memory modules $16_1$ through $16_n$ are respectively connected to dummy output enable terminals $180_1$ through $180_n$ that are formed on the wiring board 190 and are used to make external connections. In practice, a data bus for transferring regular data and a clock supply line for supplying a clock are mounted on the wiring board 190. However, these parts are omitted for the sake of simplicity.

The phase adjustment of the data outputting using the dummy output data is performed by selecting the dummy output enable terminals $180_1$ through $180_n$ one by one by a controller (for example, a direct memory access controller) connected to the memory system 200 and applying the power source voltage VCC to the selected dummy output enable terminal. The phase adjustment of the data outputting in the selected memory module is carried out as has been described previously.

Figure 16:
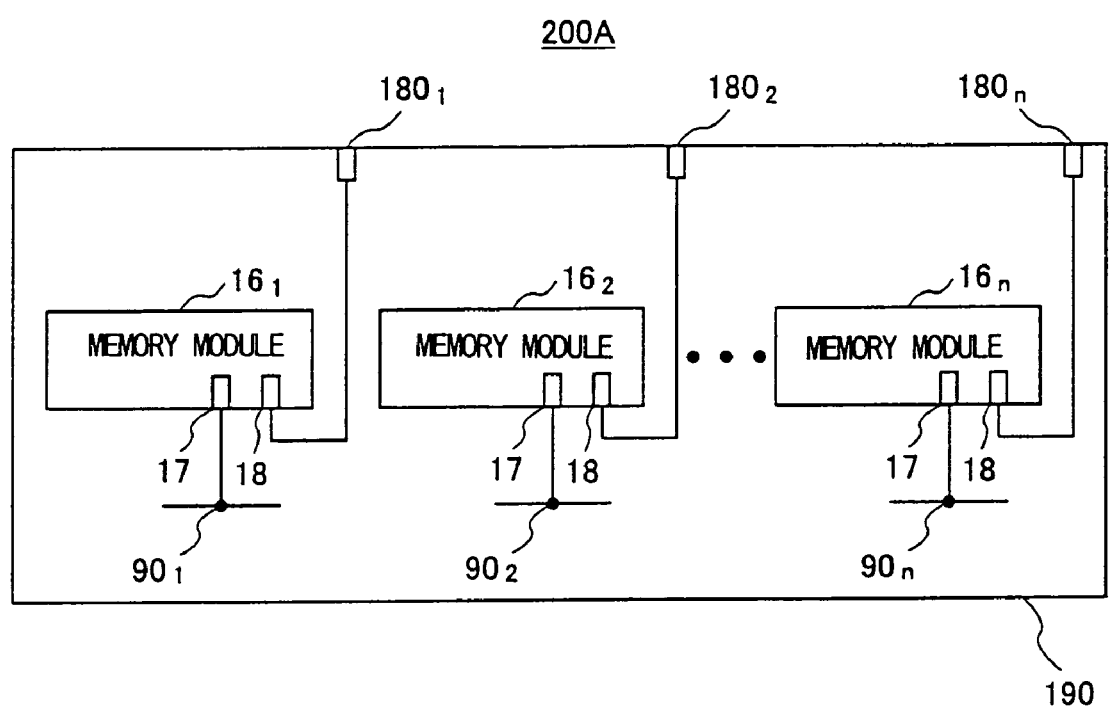
FIG. 16 is a block diagram of an overall structure of another memory system using memory modules configured according to the second embodiment of the present invention.

FIG. 16 is a block diagram of a variation of the memory system shown in FIG. 15. A memory system 200A shown in FIG. 16 is configured so that dummy output load lines $90_1$ through $90_n$ are respectively provided to the memory modules $16_1$ through $16_n$. The dummy output enable terminals 18 of the memory modules $16_1$ through $16_n$ are connected to the dummy output enable terminals $180_1$ through $180_n$ for making external connections. Since the memory modules $16_1$ through $16_n$ include the dummy output load lines $90_1$ through $90_n$, it is possible to simultaneously carry out the phase adjustment of the memory modules. The memory modules $16_1$ through $16_n$ may be supplied with the power source voltage VCC in common. In other words, only one dummy output enable terminal may be mounted on the wiring board 190 instead of the dummy output enable terminals $180_1$ through $180_n$.

In the configurations shown in FIGS. 15 and 16, the dummy output enable terminals $180_1$ through $180_n$ are not limited to the arrangements shown. For example, the dummy output enable terminals $180_1$ through $180_n$ may be arranged on the opposite side. It is also possible to employ a single dummy output enable terminal and provide a switch on the wiring board 160. An external control signal is applied to the switch, which selects the memory devices one by one.

Figure 17:
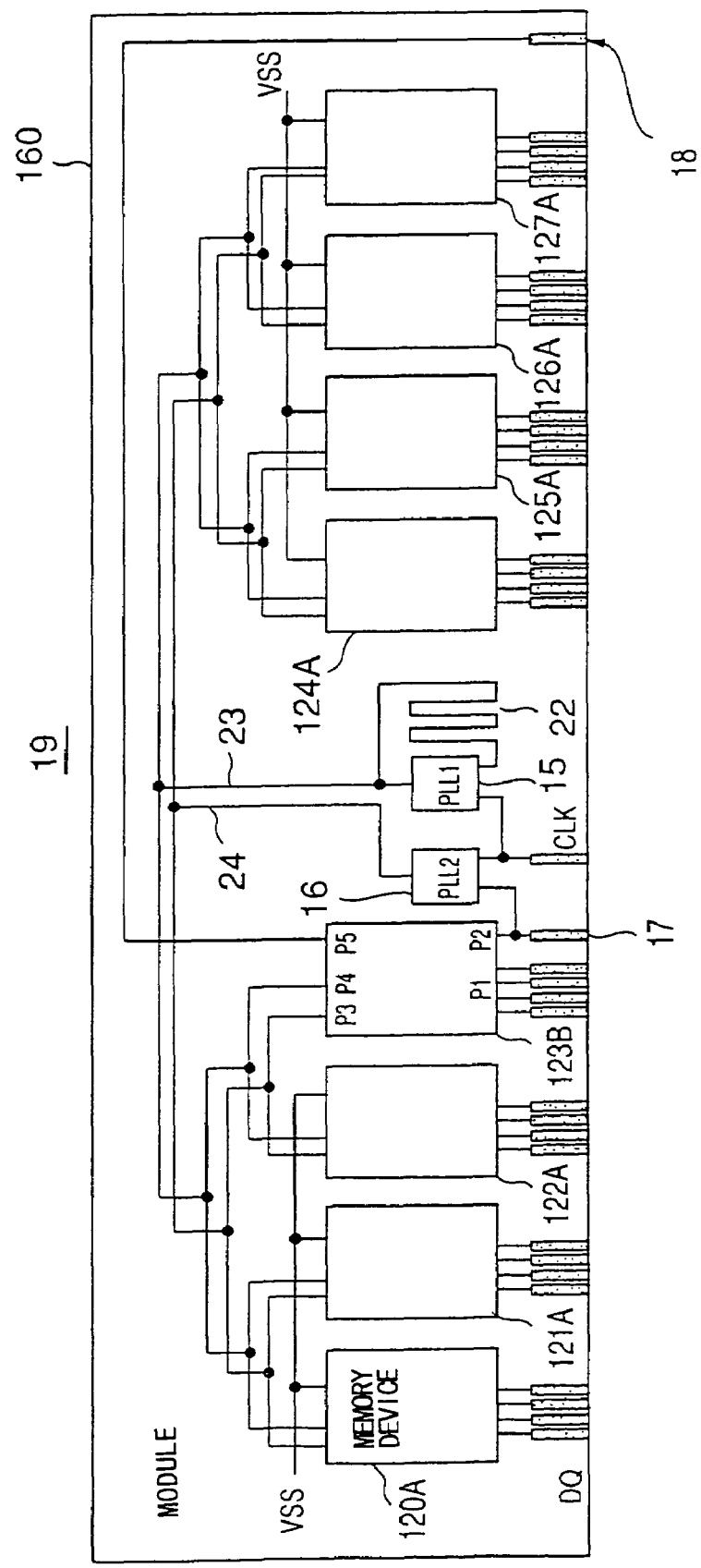
FIG. 17 is a block diagram of an overall structure of a memory module according to a third embodiment of the present invention.

FIG. 17 is a block diagram of a memory module 19 according to a third embodiment of the present invention, in which those parts that are the same as those shown in the previously described figures are given the same reference numerals. The memory module 19 has an arrangement in which the PLL circuits 15 and 16 and their peripheral circuits are provided in a central portion of the wiring board 160. This arrangement splits the memory devices 120a through 122A, 123B and 124A through 127A into two groups. The clock supply lines 23 and 24 formed in tree-like fashion are provided on a side of the wiring board opposite to a side thereof on which the data input/output lines are provided. The memory devices 120a through 122A, 123B and 124A through 127A are disposed as close to the corresponding data input/output terminals DQ as possible. Similarly, the PLL circuit 15 is disposed as close to the clock input terminal CLK supplied with the external clock as possible. Therefore, the above wiring lines have a substantially negligible delay that does not affect the operating frequency. Thus, the memory module 19 can operate in synchronism with an external clock that is higher than the external clocks applied to the aforementioned memory modules 16 and 16A. Further, the memory module 19 does not need the delay circuit 21.

Figure 18:
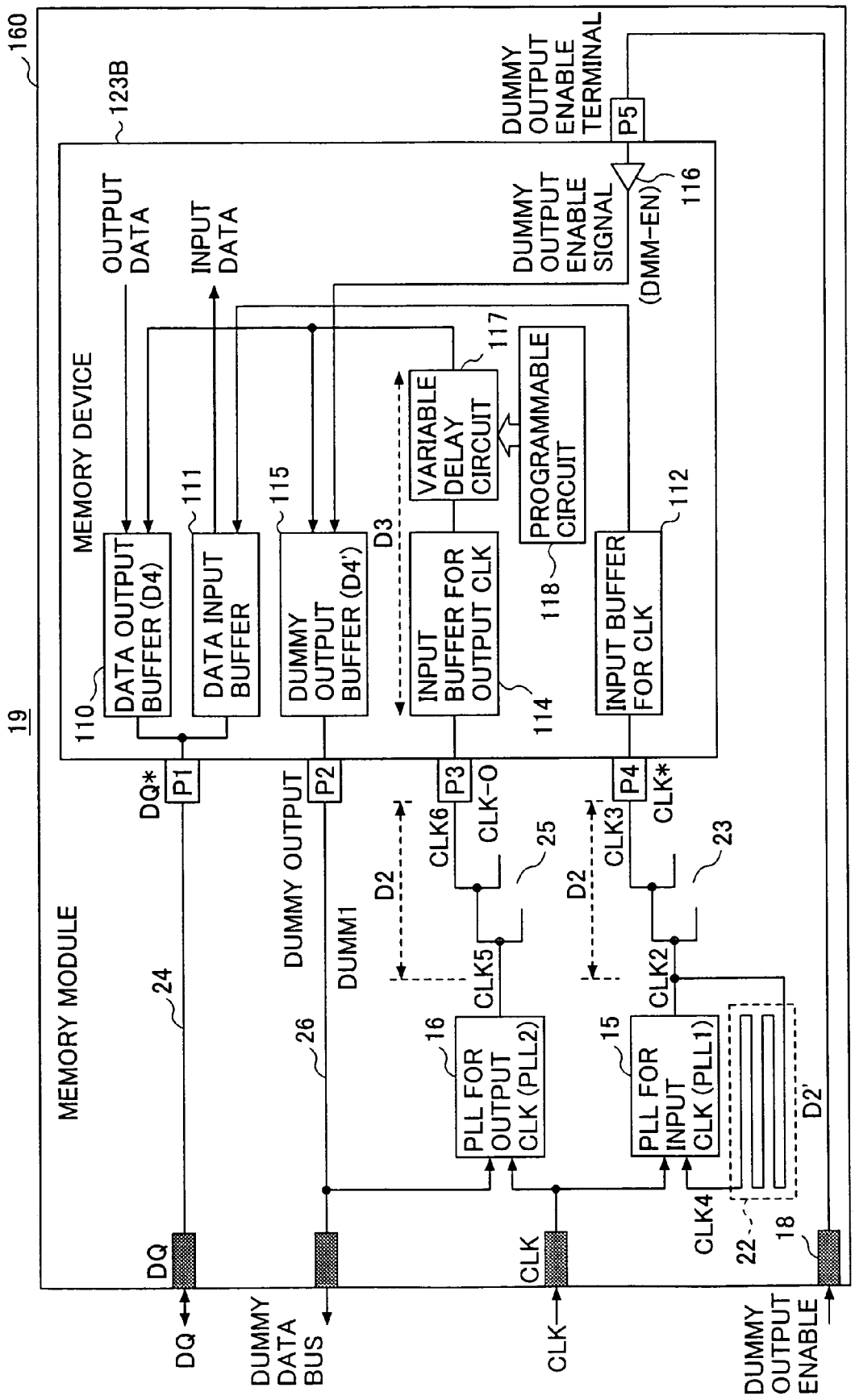
FIG. 18 is a block diagram of a circuit configuration of the memory module shown in FIG. 17.
Figure 19:
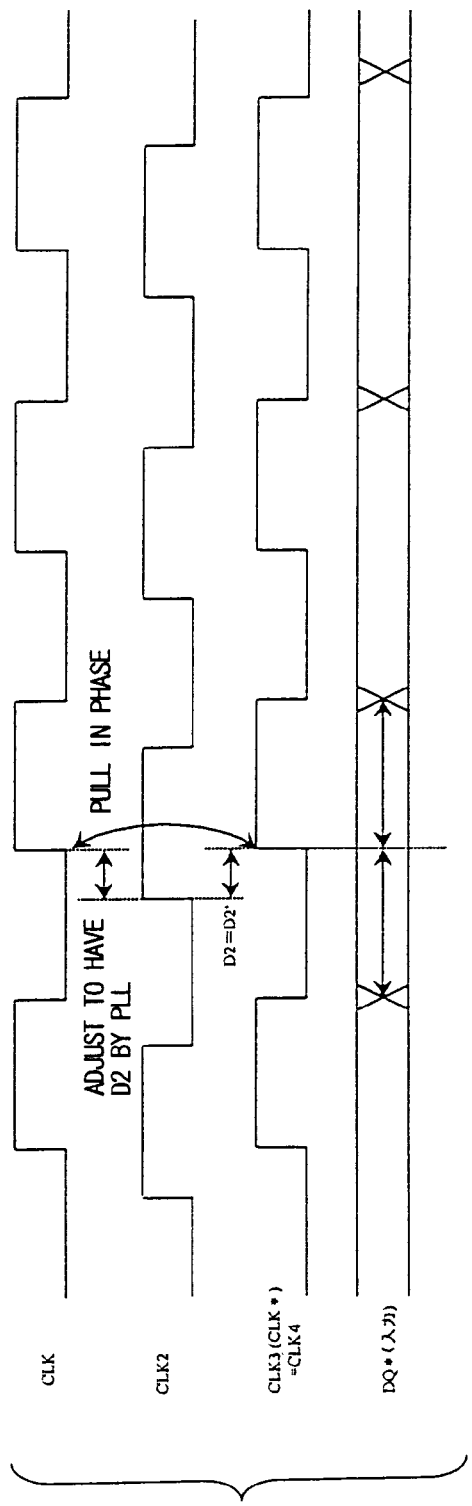
FIG. 19 is a timing chart of an operation of the memory module shown in FIG. 16 performed at the time of inputting data.
Figure 20:
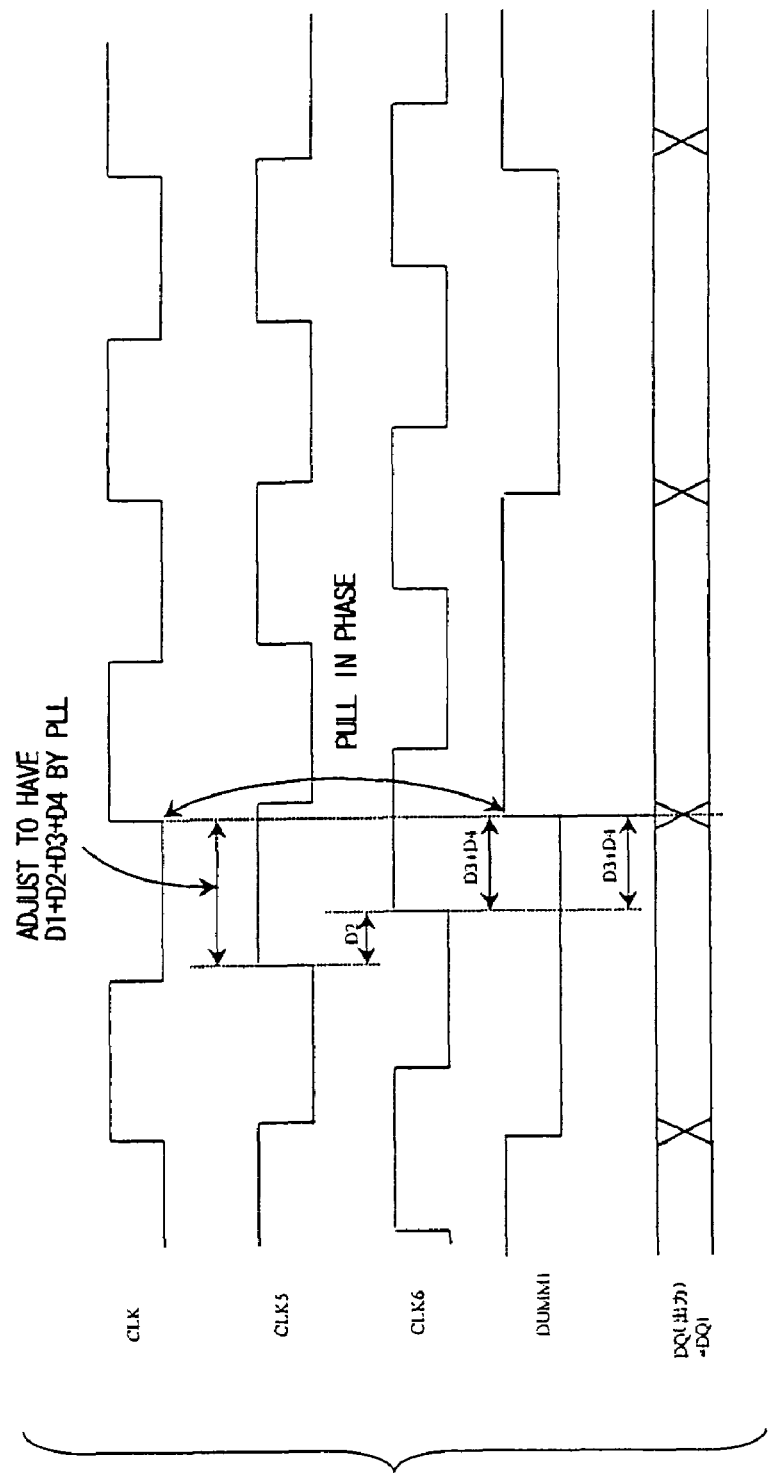
FIG. 20 is a timing chart of an operation of the memory module shown in FIG. 16 performed at the time of outputting data.

FIG. 18 is a block diagram of the peripheries of the PLL circuits 15 and 16 and an internal configuration of the memory device 123B mounted on the memory module 19 shown in FIG. 17. FIG. 19 is a timing chart of an operation of the configuration shown in FIG. 18 at the time of inputting data. FIG. 20 is a timing chart of an operation of the configuration shown in FIG. 18 at the time of outputting data.

Referring to FIG. 18, the electrical internal structure of the memory device 123B is the same as that of the memory device 123A shown in FIG. 14. However, the memory device 123B differs from the memory device 123A in that terminals P3, P4 and P5 are provided on a side opposite to the side on which the terminals P1 and P2 are provided. Further, the delay time of the data lines 24 are substantially negligible, and the delay time of the dummy output lines 26 are substantially negligible. That is, D1 and D1' shown in FIG. 8 are nearly equal to 0.

Figure 6:
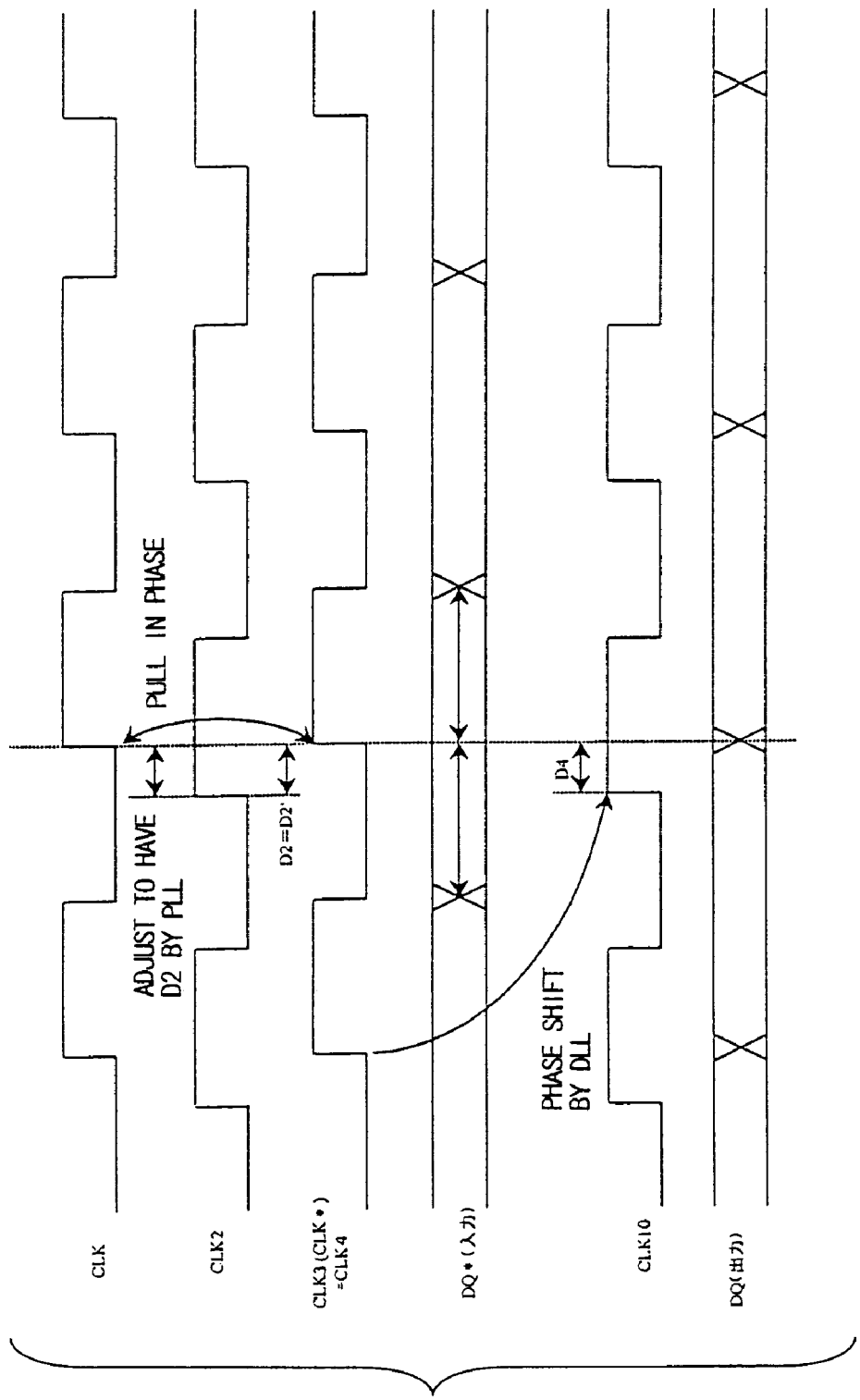
FIG. 6 is a timing chart of an operation of the module shown in FIGS. 4 and 5.

The operation shown in FIG. 19 performed at the time of inputting data is the same as that shown in FIG. 6.

In the operation performed at the time of outputting data shown in FIG. 20, the delay time of the data input/output signal lines are substantially negligible. Thus, the PLL circuit 16 adjusts the phase of the clock CLK5 so that the clock CLK5 and the dummy output data DUMM1 have a phase difference substantially equal to D2+D3+D4. This differs from the operation of the first and second embodiments of the present invention shown in FIG. 10 performed at the time of outputting data.

FIG. 21 is a block diagram of the peripheries of the PLL circuits 15 and 16 and the memory device 123B mounted on a memory module 20 according to a fourth embodiment of the present invention, in which parts that are the same as those shown in the previously described figures are given the same reference numbers.

The memory module 20 has a unique arrangement in which the clock CLK4 that is fed back to the PLL circuit 15 is used as the input clock of the PLL circuit 16. The external clock CLK supplied to the memory module 20 has been synchronized with the clock CLK4. Thus, the PLL circuit 16 that receives the clock CLK4 operates in the same manner as the PLL circuit 16 receiving the external clock CLK. Thus, it is possible to reduce the load that is driven by the external clock CLK, as compared to the arrangement in which the external clock CLK is supplied to both the PLL circuits 15 and 16. In FIG. 21, the memory module 20 may be modified by replacing the memory device 123B by the memory device 123 or 123A.

The present invention is not limited to the specifically disclosed embodiments, and variations and modifications may be made without departing from the scope of the present invention.

For example, the memory modules of the first through fourth embodiments of the present invention have a plurality of memory devices on a wiring board. However, the present invention includes modules on which semiconductor devices of another type are mounted on the wiring board. The memory modules may include circuit components other than the memory devices and PLL circuits 15 and 16. Further, the memory devices are arranged in a line in the first through fourth embodiments of the present invention. Alternatively, an arbitrary arrangement of devices or chips such as memory devices or chips may be employed. The present invention is not limited to the specifically described number of memory devices but includes an arbitrary number of devices or chips. The PLL circuits 15 and 16 may be DLL circuits.

Examples of the memory devices that operate in synchronism with the external clock are SDRAM (Synchronous DRAM) and FCRAM (First Cycle RAM). The devices or chips used in the present invention are not limited to the memory devices but may be devices that operate in synchronism with the external clock.

The present application is based on Japanese Priority Application No. 2000-172483 filed on Jun. 8, 2000, the entire contents of which are hereby incorporated.

What is claimed is:

1. A module comprising:
a semiconductor device;
a phase adjustment circuit which receives a phase adjustment signal output from said semiconductor device and a first clock supplied from an exterior of said module, and generates a second clock; and
an output circuit that is provided in the semiconductor device and generates the phase adjustment signal from the second clock, wherein said phase adjustment circuit adjusts a phase of the second clock such as to fix relative phase difference between the phase adjustment signal and the first clock, wherein
said semiconductor device is a semiconductor memory device including an output buffer from which data stored in memory cells are output in synchronism with the second clock, and wherein
a delay of the data along a oath from the semiconductor device to the exterior of the module is substantially the same as a delay of the phase adjustment signal along a path from the semiconductor device to the phase adjustment circuit.

2. A module comprising:
semiconductor devices;
a phase adjustment circuit generating a second clock based on a phase adjustment signal output from a first semiconductor device that is one of the semiconductor devices and a first clock supplied from an exterior of the module, the second clock being supplied to the semiconductor devices; and
a wiring board on which the semiconductor devices and the phase adjustment circuit are mounted,
the first semiconductor device including an output circuit generating the phase adjustment signal from the second clock, wherein said phase adjustment circuit adjusts a phase of the second clock such as to fix a relative phase difference between the phase adjustment signal and the first clock, wherein
each of said semiconductor devices is a semiconductor memory device including an output buffer from which data in memory cells are output in synchronism with the second clock, and wherein
a delay of the data along paths from the semiconductor devices to the exterior of the module is substantially the same as a delay of the phase adjustment signal along a path from the first semiconductor device to a phase adjustment circuit.

3. The module as claimed in claim 2, wherein the module comprises first data lines over which data output from the semiconductor devices are transferred, and a second data line over which the phase adjustment signal output from the first semiconductor device is transferred,
the first and second data lines being provided on the wiring board.

4. The module as claimed in claim 3, wherein the first and second data lines are arranged on opposite sides of the wiring board so that the semiconductor devices are sandwiched between the first and second data lines.

5. The module as claimed in claim 3, wherein the first and second data lines have a substantially identical delay amount.

6. The module as claimed in claim 3, wherein the first and second data lines have a length that allows their delay amounts to be negligible.

7. The module as claimed in claim 2, wherein the module comprises first data lines over which data output from the semiconductor devices are transferred, and a second data line over which the phase adjustment signal output from the first semiconductor device is transferred,
the first and second data lines being provided on the wiring board.

8. The module as claimed in claim 7, wherein the first and second data lines are arranged on an identical side of the wiring board.

9. The module as claimed in claim 7, wherein the first and second data lines are arranged on an identical side of the wiring board.

10. The module as claimed in claim 7, wherein the first and second data lines are arranged on opposite sides of the wiring board so that the semiconductor devices are sandwiched between the first and second data lines.

11. The module as claimed in claim 7, wherein the first and second data lines have a length that allows their delay amounts to be negligible.

12. The module as claimed in claim 7, wherein the first and second data lines have a substantially identical delay amount.

13. The module as claimed in claim 2, further comprising a terminal that is provided on the wiring board and is used to output the phase adjustment signal to an outside of the module.

14. The module as claimed in claim 2, wherein the first semiconductor device generates the phase adjustment signal in accordance with a predetermined signal given from an outside of the first semiconductor device.

15. The module as claimed in claim 2, wherein:
the semiconductor devices including the first semiconductor device have an identical circuit configuration; and
the first semiconductor device has an output circuit that receives an external instruction that instructs the first semiconductor device to generate the phase adjustment signal.

16. The module as claimed in claim 2, wherein the first clock is supplied from an outside of the module.

17. The module as claimed in claim 2, further comprising a circuit generating the first clock from an external clock.

18. The module as claimed in claim 2, wherein each of the semiconductor devices comprises a programmable delay circuit that delays the second clock.

19. The module as claimed in claim 2, wherein the semiconductor devices comprise semiconductor memory devices.

20. The module as claimed in claim 2, wherein the phase adjustment circuit generates the second clock from dummy output data output by the first semiconductor device.

21. The module as claimed in claim 2, further comprising a second phase adjustment circuit generating a third clock so that the third clock and the first clock have a predetermined phase relationship, the third clock being supplied to the semiconductor devices.

22. The module as claimed in claim 21, wherein the first clock corresponds to the third clock.

23. A system comprising:
modules;
a wiring board on which the modules are mounted; and
a dummy output load line serving as loads of dummy output data output from the modules, wherein the modules comprise a module including;
a semiconductor devices, one of which is a first semiconductor device that outputs a phase adjustment signal; and
a phase adjustment circuit which receives the phase adjustment signal output from said first semiconductor device and a first clock supplied from an exterior of said module, and generates a second clock, the second clock being supplied to the semiconductor devices, the first semiconductor device including an output circuit generating the phase adjustment signal from the second clock, wherein said phase adjustment circuit adjusts a phase of the second clock such as to fix a relative phase difference between the phase adjustment signal and the first clock, wherein each of said semiconductor devices is a semiconductor memory device including an output buffer from which data stored in memory cells are output in synchronism with the second clock, and wherein a delay of the data along paths from the semiconductor devices to the exterior of the module is substantially the same as a delay of the phase adjustment signal along a path from the first semiconductor device to the phase adjustment circuit.

24. The system as claimed in claim 23, wherein the dummy output load line is provided in common to the modules.

25. The system as claimed in claim 23, wherein the dummy output load line comprises parts respectively provided to the modules.

* * * * *